United States Patent
Takeuchi et al.

(10) Patent No.: US 10,720,493 B2
(45) Date of Patent: Jul. 21, 2020

(54) SILICON CARBIDE SEMICONDUCTOR DEVICE AND MANUFACTURING METHOD THEREFOR

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Yuichi Takeuchi, Kariya (JP); Katsumi Suzuki, Toyota (JP); Yukihiko Watanabe, Nagakute (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/304,866

(22) PCT Filed: Jun. 29, 2017

(86) PCT No.: PCT/JP2017/023989
§ 371 (c)(1),
(2) Date: Nov. 27, 2018

(87) PCT Pub. No.: WO2018/008528
PCT Pub. Date: Jan. 11, 2018

(65) Prior Publication Data
US 2019/0386095 A1  Dec. 19, 2019

(30) Foreign Application Priority Data
Jul. 5, 2016 (JP) .................................. 2016-133674

(51) Int. Cl.
*H01L 29/06* (2006.01)
*H01L 29/08* (2006.01)
(Continued)

(52) U.S. Cl.
CPC ...... *H01L 29/0619* (2013.01); *H01L 29/0661* (2013.01); *H01L 29/086* (2013.01);
(Continued)

(58) Field of Classification Search
CPC .................. H01L 29/0619; H01L 29/0661; H01L 29/086
(Continued)

(56) References Cited

U.S. PATENT DOCUMENTS

2005/0258454 A1* 11/2005 Kumar .................. H01L 27/098
257/211
2009/0008651 A1* 1/2009 Okuno ................ H01L 29/6606
257/77
(Continued)

FOREIGN PATENT DOCUMENTS

| WO | 2018/008526 A1 | 1/2018 |
| WO | 2018/008527 A1 | 1/2018 |
| WO | 2018/008529 A1 | 1/2018 |

OTHER PUBLICATIONS

U.S. Appl. No. 16/304,783, filed Nov. 27, 2018, Takeuchi et al.
U.S. Appl. No. 16/304,752, filed Nov. 27, 2018, Takeuchi et al.
U.S. Appl. No. 16/305,164, filed Nov. 28, 2018, Takeuchi et al.

*Primary Examiner* — Igwe U Anya
(74) *Attorney, Agent, or Firm* — Posz Law Group, PLC

(57) ABSTRACT

Intervals of the frame portion and the p type guard ring on a cell portion side are made narrower than other parts, and the narrowed part provides a dot line portion. By narrowing the intervals of the frame portion and the p type guard ring on the cell portion side, the electric field concentration is reduced on the cell portion side, and the equipotential line directs to more outer circumferential side. By providing the dot line portions, the difference in the formation areas of the trench per unit area in the cell portion, the connection portion and the guard ring portion is reduced, and the thicknesses of the p type layers formed on the cell portion,
(Continued)

the connection portion and the guard ring portion are uniformed. Thereby, when etching-back the p type layer, the p type layer is prevented from remaining as a residue in the guard ring portion.

11 Claims, 15 Drawing Sheets

(51) Int. Cl.
*H01L 29/10* (2006.01)
*H01L 29/16* (2006.01)
*H01L 29/66* (2006.01)
*H01L 29/78* (2006.01)
*H01L 29/872* (2006.01)

(52) U.S. Cl.
CPC ...... *H01L 29/0878* (2013.01); *H01L 29/1095* (2013.01); *H01L 29/1608* (2013.01); *H01L 29/6606* (2013.01); *H01L 29/66068* (2013.01); *H01L 29/7813* (2013.01); *H01L 29/872* (2013.01)

(58) Field of Classification Search
USPC .......................................................... 257/77
See application file for complete search history.

(56) References Cited

U.S. PATENT DOCUMENTS

| | | |
|---|---|---|
| 2009/0200559 A1 | 8/2009 | Suzuki et al. |
| 2011/0309464 A1 | 12/2011 | Yamamoto et al. |
| 2012/0012306 A1* | 1/2012 | Treadaway ........... E21B 33/129 166/216 |
| 2012/0126328 A1 | 5/2012 | Lin |
| 2015/0115286 A1* | 4/2015 | Takeuchi ............ H01L 21/8213 257/77 |
| 2016/0104794 A1 | 4/2016 | Takeuchi et al. |
| 2018/0151366 A1 | 5/2018 | Endo et al. |

* cited by examiner

SILICON CARBIDE SEMICONDUCTOR DEVICE AND MANUFACTURING METHOD THEREFOR

CROSS REFERENCE TO RELATED APPLICATIONS

This application is a U.S. national phase of International Application No. PCT/JP2017/023989 filed on Jun. 29, 2017 and is based on Japanese Patent Application No. 2016-133674 filed on Jul. 5, 2016, the contents of which are incorporated herein by reference.

TECHNICAL FIELD

The present disclosure relates to a silicon carbide (hereinafter referred to as SiC) semiconductor device having a deep layer and a guard ring layer and a method of manufacturing the same.

BACKGROUND ART

Conventionally, SiC has attracted attention as a material of power devices that can obtain high electric field breakdown strength. As a power device of SiC, for example, a MOSFET, a Schottky diode and the like have been proposed (see, for example, Patent Literature 1).

A power device made of SiC includes a cell portion in which a power element such as a MOSFET or a Schottky diode is formed and a guard ring portion surrounding the periphery of the cell portion. Between the cell portion and the guard ring portion, a connection portion for connecting these portions is arranged. Then, in the outer peripheral region including the guard ring portion, by hollowing the surface of the semiconductor substrate to form a concave portion, a mesa portion is provided by protruding the connection portion and the cell portion with an island shape in the thickness direction of the substrate.

PRIOR ART LITERATURES

Patent Literature

Patent Literature 1: JP-2011-101036-A

SUMMARY

In the case where the concave portion is formed in the outer peripheral region including the guard ring portion, the connection portion is arranged between the cell portion and the guard ring portion, and the mesa portion is formed by protruding the cell portion and the connection portion in an island shape as described above, it is confirmed that the withstand voltage required for the power device may not be obtained.

It is an object of the present disclosure to provide a SiC semiconductor device including a power element for securing a withstand voltage and a manufacturing method thereof.

According to an aspect of the present disclosure, a SiC semiconductor device includes a substrate with a first or second conductivity type and a drift layer with a first conductivity type arranged on the front surface side of the substrate and having a lower impurity concentration than the substrate. In addition to the cell portion, an outer peripheral portion is formed such that the outer peripheral portion includes a guard ring portion surrounding the outer periphery of the cell portion and a connection portion located between the guard ring portion and the cell portion. In the cell portion or the cell portion and the connection portion, a second conductivity type layer is arranged such that the second conductivity type layer is disposed in a plurality of line-shaped first trenches formed in the drift layer with a stripe shape, and is made of an epitaxial film having the second conductivity type. Further, in the cell portion, a vertical type semiconductor device for flowing current between a first electrode and a second electrode is arranged, and includes the first electrode electrically connected to the second conductivity type layer and the second electrode formed on the back side of the substrate. The guard ring portion or the guard ring portion and the connecting portion includes a second conductivity type ring, which is disposed in a second trench formed from the surface of the drift layer and has a plurality of frame shapes surrounding the cell portion, and is made of an epitaxial film. At least a part of the second conductive type ring positioned on the outer peripheral side is a guard ring provided in the guard ring portion and at least a part of the guard ring is a ring portion formed in a line shape. A plurality of dot line portions in which the second conductivity type rings are formed in a dot line shape are arranged inside the ring portion of the second conductivity type ring. The interval between the dot line portions is made narrower than the interval between the ring portions.

According to such a configuration, in the dot ring portion and the ring portion, a difference in formation area of the trench per unit area can be reduced. Therefore, when forming the second conductivity type layer, the difference in the amount of the second conductivity type layer embedded in the trench per unit area also decreases. This makes it possible to equalize the thickness of the second conductivity type layer formed on the cell portion and the outer circumference portion. Therefore, when the second conductivity type layer is etched back, it is possible to prevent the second conductivity type layer from remaining as a residue in the guard ring portion. Therefore, it becomes possible to provide a SiC semiconductor device including a semiconductor element capable of securing withstand voltage.

EMBODIMENTS

Figure 1:
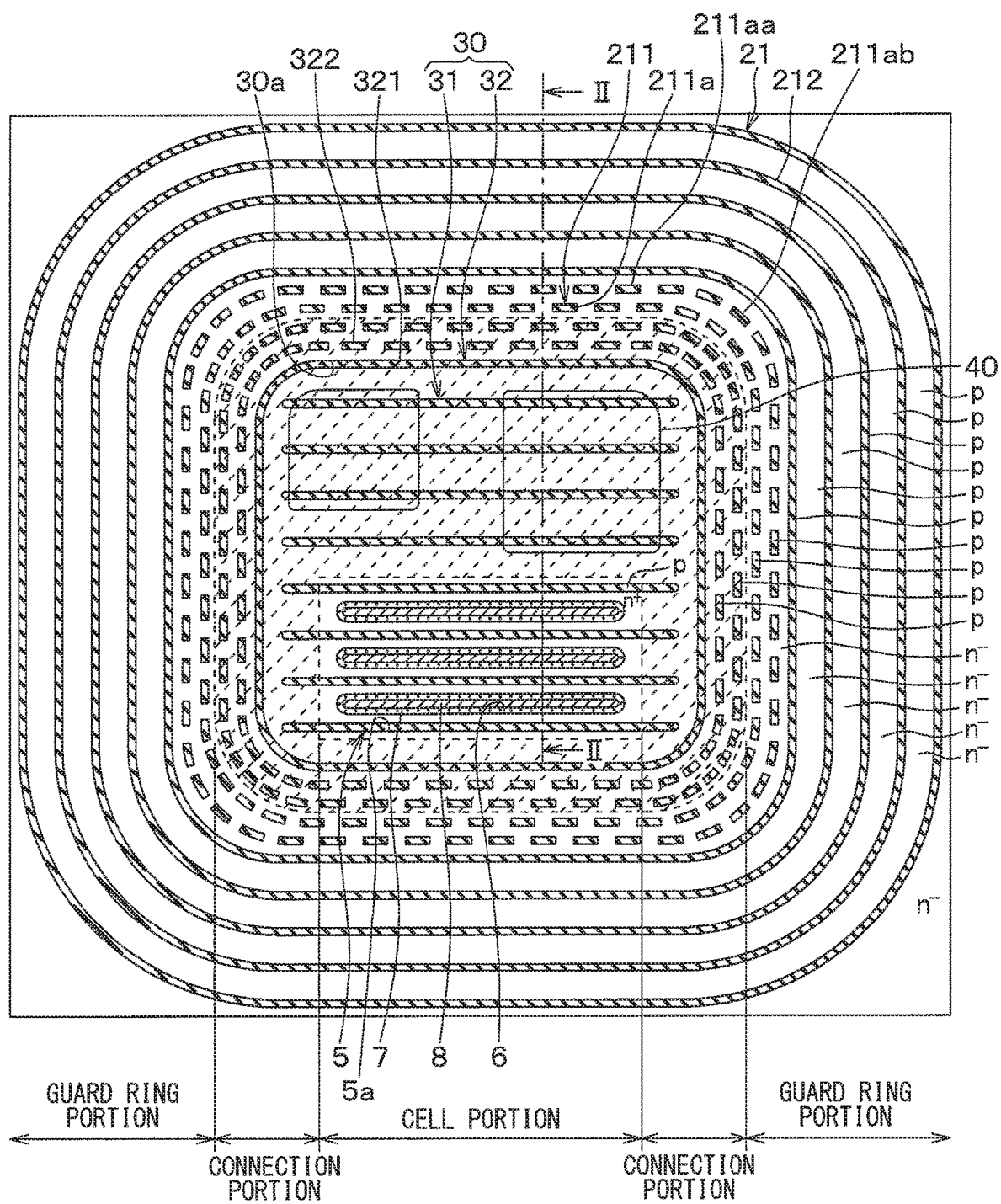
FIG. 1 is a diagram schematically showing a top layout of a SiC semiconductor device according to a first embodiment.

Embodiments of the present disclosure will be described below with reference to the drawings. In each embodiment described below, same or equivalent parts are designated with the same reference numerals.

First Embodiment

A first embodiment will be described. Here, an SiC semiconductor device in which an inversion type MOSFET having a trench gate structure is formed as a power element providing a semiconductor element will be described as an example.

The SiC semiconductor device shown in FIG. 1 has a cell portion in which a MOSFET having a trench gate structure is formed, and an outer peripheral portion surrounding the cell portion. The outer peripheral portion has a guard ring portion and a connection portion disposed inside the guard ring portion, that is, between the cell portion and the guard ring portion. Although FIG. 1 is not a cross-sectional view, hatching is partially shown in order to make the figure easy understandable.

Figure 2:
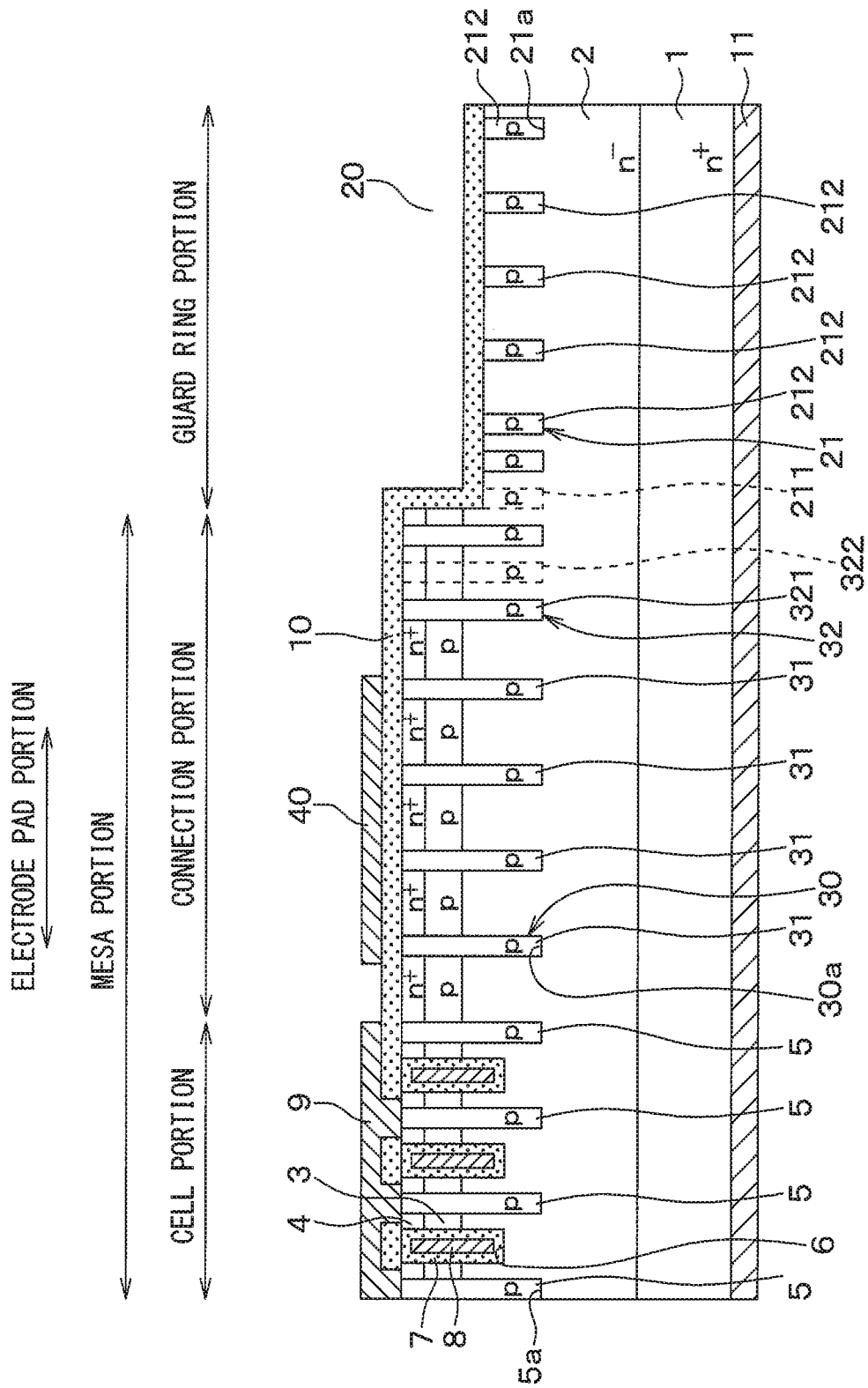
FIG. 2 is a cross-sectional view taken along line II-II in FIG. 1.

As shown in FIG. 2, the SiC semiconductor device is formed using an $n^+$ type substrate 1 made of SiC. On the main surface of the $n^+$ type substrate 1, an $n^-$ type drift layer 2, a p type base region 3, and the $n^+$ type source region 4 are made of SIC and are sequentially epitaxially grown.

For example, the $n^+$ type substrate 1 has an n type impurity concentration of $1.0 \times 10^{19}/cm^3$, and its surface is a (0001) Si plane. The $n^-$ type drift layer 2 has, for example, an n type impurity concentration of $0.5 \times 10^{16}/cm^3$ to $2.0 \times 10^{16}/cm^3$.

Further, the p type base region 3 has a portion where a channel region is formed, and the portion has the p type impurity concentration of, for example, about $2.0 \times 10^{17}/cm^3$ and the thickness of 300 nm. The $n^+$ type source region 4 has a higher impurity concentration than the $n^-$ type drift layer 2, and has the n type impurity concentration in the surface portion of, for example, $2.5 \times 10^{18}/cm^3$ to $1.0 \times 10^{19}/cm^3$, and the thickness of about 0.5 μm.

In the cell portion, the p type base region 3 and the $n^+$ type source region 4 are left on the surface side of the $n^+$ type substrate 1, and in the guard ring portion, the concave portion 20 is formed to penetrate the $n^+$ type source region 4 and the p type base region 3 and to reach the $n^-$ type drift layer 2. By adopting such a structure, a mesa structure is formed.

In the cell portion, a p type deep layer 5 is formed so as to penetrate the $n^+$ type source region 4 and the p type base region 3 and to reach the $n^-$ type drift layer 2. The p type deep layer 5 has a higher p type impurity concentration than the p type base region 3. More specifically, a plurality of p type deep layers 5 are arranged at equal intervals at least in the $n^-$ type drift layer 2, and as shown in FIG. 1, the p type deep layers 5 are arranged in the stripe-shaped trenches 5a which are separated from each other without intersecting each other, and is made of a p type epitaxial film in an epitaxial growth process. The trench 5a corresponds to a deep trench, and has a depth of, for example, 1 micrometer or less and an aspect ratio of 2 or more. The p type deep layer 5 shown in FIG. 1, the trench gate structure and the connection layer 30 which will be described later and the like are actually provided in the illustrated number or more, but for simplicity, the number is reduced and described.

For example, each p type deep layer 5 has a p type impurity concentration of, for example, $1.0 \times 10^{17}/cm^3$ to $1.0 \times 10^{19}/cm^3$, a width of 0.7 micro-meters, and a depth of about 2.0 micro meters. The p type deep layer 5 is formed from one end to the other end of the cell portion as shown in FIG. 1. Further, the p type deep layer 5 extends along a longitudinal direction same as the extending direction of the trench gate structure to be described later, and is connected to a p type connection layer 30, which will be described later, extending further to the outside of the cell portion than both ends of the trench gate structure.

Although the extending direction of the p type deep layer 5 may be arbitrary, both walls of the trench 5a, which face each other, provide a long side of the trench 5a, and extend in the <11-20> direction, are the same (1-100) plane. Thus, the growth at the embedding and epitaxial growth process is homogeneous on both wall surfaces. Therefore, the film quality can be made uniform and the effect of suppressing the embedding failure can also be obtained.

A gate trench 6 having a width of 0.8 μm and a depth of 1.0 μm, for example, is formed so as to penetrate the p type base region 3 and the $n^+$ type source region 4 and to reach the n⁻ type drift layer 2. The above described p type base region 3 and n⁺ type source region 4 are arranged so as to be in contact with the side surface of the gate trench 6. The gate trench 6 is formed in a line-like layout in which the lateral direction of the drawing surface of FIG. 2 is the width direction, the direction perpendicular to the drawing surface is the longitudinal direction, and the vertical direction of the drawing surface is the depth direction. In addition, as shown in FIG. 1, a plurality of gate trenches 6 are arranged so as to be sandwiched between p type deep layers 5, respectively, and are arranged in a stripe shape manner in parallel to each other at equal intervals.

A portion of the p type base region 3 located on the side surface of the gate trench 6 functions as a channel region connecting between the n⁺ type source region 4 and the n⁻ type drift layer 2 during the operation of the vertical MOSFET. A gate insulation film 7 is formed on the inner wall surface of the gate trench 6 including the channel region. A gate electrode 8 made of doped Poly-Si is formed on the surface of the gate insulation film 7, and the inside of the gate trench 6 is filled with the gate insulation film 7 and the gate electrode 8.

On the surfaces of the n⁺ type source region 4 and the p type deep layer 5, and on the surface of the gate electrode 8, a source electrode 9 corresponding to the first electrode and a gate pad 40 arranged in an electrode pad portion are formed. The source electrode 9 and the gate pad 40 are made of a plurality of metals, for example, Ni/Al or the like. A portion of at least n type SiC among a plurality of metals, specifically, a portion in contact with the gate electrode 8 in the case of the n⁺ type source region 4 or the n type doping portion, is made of a metal capable of ohmic contact with the n type SiC. In addition, at least a portion of at least p type SiC among the plurality of metals, specifically, a portion in contact with the p type deep layer 5, is made of a metal capable of ohmic contact with the p type SiC. Here, the source electrode 9 and the gate pad 40 are formed on the interlayer insulation film 10 to be electrically insulated. Then, through the contact hole formed in the interlayer insulation film 10, the source electrode 9 is electrically connected to the n⁺ type source region 4 and the p type deep layer 5, and the gate pad 40 is electrically connected to the gate electrode 8.

Further, a drain electrode 11 corresponding to a second electrode electrically connected to the n⁺ type substrate 1 is formed on the back side of the n⁺ type substrate 1. With such a structure, an n channel inversion type trench gate structure MOSFET is provided. Then, a plurality of such MOSFETs are arranged in a plurality of cells respectively to form a cell portion.

On the other hand, in the guard ring portion, as described above, the concave portion 20 is formed so as to penetrate the n⁺ type source region 4 and the p type base region 3 and to reach the n⁻ type drift layer 2. Therefore, the n⁺ type source region 4 and the p type base region 3 are removed at a position distant from the cell portion, and the n⁻ type drift layer 2 is exposed. In the thickness direction of the n⁺ type substrate 1, a cell portion and a connecting portion located inside the recess 20 are mesa portions protruding like islands.

A plurality of p type guard rings 21 are arranged on the surface layer portion of the n⁻ type drift layer 2 located below the concave portion 20 so as to surround the cell portion. In FIG. 1, seven p type guard rings 21 are shown. In the case of the present embodiment, the p type guard ring 21 has a quadrangular shape in which the four corners are rounded. Alternatively, the ring 21 may have another frame shape such as a circular shape. The p type guard ring 21 is disposed in the trench 21a, which penetrates the n⁺ type source region 4 and the p type base region 3 and reaches the n⁻ type drift layer 2, and is made of a p type epitaxial film by epitaxial growth. The trench 21a corresponds to a guard ring trench.

In the present embodiment, the p type guard ring 21 has a quadrangular shape with four corners rounded. Each part constituting the p type guard ring 21 has the same structure as the above described p type deep layer 5. The p type guard ring 21 has a frame shape in the upper surface shape thereof formed in a dotted line shape or a line shape and surrounding the cell portion and the connecting portion, and the width of the guard ring 21 is increased toward the outer periphery. These features are different from the deep layer 5 formed to have a constant width and a linear shape, but the others are the same. Specifically, the portion on the inner circumference side of the p type guard ring 21 is defined as the dot line portion 211, and the portion on the outer circumference side thereof is defined as the ring portion 212.

The dot line portion 211 is formed by arranging, for example, a plurality of strip-like dot portions 211a in a frame shape. The size of each dot portion 211a is arbitrary, but the dot portions 211aa positioned in the linear portion of the guard ring portion formed into a rectangular shape with rounded corners are formed in a rectangular shape having the same size, and the dot portions 211ab positioned in the arc shaped portion of the guard ring portion are formed in an arc shape having the same size. For example, each dot portion 211aa has a width of 0.7 μm and a longitudinal dimension of 3 μm, and each dot portion 211ab has a width of 0.7 μm and an arc dimension of 3 μm at the center position in the width direction. The intervals between the dot portions 211aa and 211ab in the dot line portion 211 of the same line is made narrower than the interval between the adjacent dot line portions 211.

In addition, a plurality of frame-shaped lines formed by the dot line portion 211 are formed. For example, the interval between the dot line portions 211 is 1 μm. In the adjacent dot line portion 211, a portion between the dot portions 211a constituting each dot line portion 211, i.e, the gap portion which is not the dot portions 211a, in the radial direction from the center of the dot line portion 211 is not arranged in a straight line. Hereinafter, the gap portion between the dot portions 211a is simply referred to as a gap portion. For example, in the radial direction from the center of the dot line portion 211, each gap portion of the dot line portion 211 arranged on the inner circumference side of and next to the dot line portion 211 and the center of the dot portion 211a of the dot line portion 211 arranged on the outer circumference side of and next to the dot line portion 211 in the longitudinal direction are positioned on a straight line.

In the periphery of the cell portion, the interval between the p type guard rings 21 is narrowed on the cell portion side and becomes large toward the outer peripheral side, so that the electric field concentration on the inner circumferential side, that is, the cell portion side is relaxed and the equipotential line directs to more outer circumferential side. Therefore, in the present embodiment, the interval between adjacent ones of the plurality of frame line-shaped dot line portions 211 is set to be equal to or less than the interval between the p type deep layers 5 and the interval between the ring portions 212. For example, the interval between adjacent ones of the plurality of dot line portions 211 is set to about 1 μm. The interval between the ring portions 212 is set to be equal to or less than the interval between the p type deep layers 5.

In the present embodiment, the width of the dot line portion 211, that is, the width of each dot portion 211a in the radial direction from the center of the dot line portion 211 and the width of the ring portion 212 are set to be constant. Alternatively, they may be different from each other. For example, the width of each of the dot portions 211a and the width of the ring portion 212 may be widened from the center of the dot line portion 211 toward the outer periphery side. Although the interval between the ring portions 212 is set to be constant in the present embodiment, it may be designed so that it gradually increases from the center of the ring portion 212 toward the outer periphery side.

In this manner, the inner circumferential side of the guard ring portion is constituted by the dot line portion 211 and the outer circumferential side is constituted by the ring portion 212. Therefore, even when the interval between the dot line portions 211 is narrower than the interval between the ring portions 212, the p type layer per unit area is made uniform in the radial direction from the center of the guard ring portion toward the outer periphery side. That is, the area of the p type layer per unit area can be made substantially equal to each other on both the inner circumferential side of the guard ring portion where the dot line portion 211 is formed and the outer circumferential side of the guard ring portion where the ring portion 212 is formed.

Although not shown, the EQR structure is arranged on the outer periphery of the p type guard ring 21 as necessary, so that a guard ring portion having an outer peripheral withstand voltage structure surrounding the cell portion is provided.

Furthermore, a p type connection layer 30 is formed in the surface layer portion of the n⁻ type drift layer 2 at the connection portion, provided by a portion extending from the cell portion to the guard ring portion as the connection portion. In the case of the present embodiment, as shown in FIG. 1, a connection portion is formed so as to surround the cell portion, and furthermore, a plurality of rectangular p type guard rings 21 with four corners are formed so as to surround the outside of the connecting portion. The p type connection layer 30 is formed in such a manner as to include a linear portion 31 arranged in a stripe shape by arranging a plurality of the linear portions 31 in parallel to the p type deep layer 5 formed in the cell portion, and a frame portion 32 formed by arranging one or a plurality of the frame portions 32 to surround the p type deep layer 5 and the linear portion 31.

The linear portion 31 is formed between the cell portion and the frame portion 32 so as not to generate a place where the equipotential line rises excessively in the region between the cell portion and the frame portion 32 since the p type layer is not formed in the n⁻ type drift layer 2. A plurality of linear portions 31 are arranged in parallel with the p type deep layer 5 between the cell portion and the frame portion 32 in the direction perpendicular to the longitudinal direction of the p type deep layer 5. Between the cell portion in the longitudinal direction of the p type deep layer 5 and the frame portion 32, the linear portion 31 is formed so as to be connected to the tip of the p type deep layer 5. As described above, the linear portion 31 is disposed between the cell portion and the frame portion 32, and the distance between the linear portion 31 and the frame portion 32 is equal to or smaller than the distance between the p type deep layers 5.

The frame portion 32 has a rectangular shape with four corners rounded, and surrounds the cell portion and the periphery of the linear portion 31. Specifically, the frame portion 32 is arranged concentrically with the guard ring portion. In the present embodiment, a plurality of frame portions 32 are provided, and one of the frame portions 32 on the inner periphery side is defined as a line-shaped ring portion 321 and the one of the frame portions 32 on the outer periphery is defined as a dot line-shaped dot line portion 322. The configuration of the ring portion 321 is the same as that of the ring portion 212 in the guard ring portion. The configuration of the dot line portion 322 is the same as that of the dot line portion 211 in the guard ring portion.

Each p type connection layer 30 constituted by the linear portion 31 and the frame portion 32 is formed in the trench 30a penetrating the n⁺ type source region 4 and the p type base region 3 and reaching the n⁻ type drift layer 2, and is constituted by a p type epitaxial film formed by epitaxial growth. The trench 30a corresponds to a connection trench, and has a depth of, for example, 1 micrometer or less and an aspect ratio of 2 or more. Since the p type connection layer 30 is in contact with the p type base region 3, the potential of the p type connection layer 30 is fixed at the source potential.

In the case of this embodiment, the linear portion 31 of the p type connection layer 30 has the same width as the p type deep layer 5, and the interval between the linear portions 31 is the same as the interval between the p type deep layers 5. Regarding the frame portion 32, the ring portion 321 has the same width and the same interval as the ring portion 221 in the guard ring portion, and the dot line portion 322 has the same width and the same interval as the dot line portion 211 in the guard ring portion.

In this manner, the inner circumferential side of the connecting portion is constituted by the ring portion 321 and the outer circumferential side is constituted by the dot line portion 322. Therefore, even when the interval between the dot line portions 322 is narrower than the interval between the ring portions 321, the area of the p type layer per unit area is made uniform in the radial direction from the center of the frame portion 32 toward the outer periphery side. That is, the area of the p type layer per unit area can be made substantially equal to each other on both the inner circumferential side of the guard ring portion where the dot line portion 322 is formed and the outer circumferential side of the guard ring portion where the ring portion 321 is formed.

Although the frame portion 32 has been described in distinction from the p type guard ring 21, the frame portion 32 and the p type guard ring 21 may constitute a concentric p type ring having a plurality of frame shapes. In other words, it can be said that the portion of the p type ring disposed radially inward of the concave portion 20 constitutes the frame portion 32, and the portion formed in the concave portion 20 constitutes the p type guard ring 21. Then, at the boundary position of the concave portion 20, that is, at the boundary position between the mesa portion and the guard ring portion, the p type ring is formed as the dot line shaped dot line portions 211, 322. Further, the interval between the p type rings is increased in the ring portions 212 and 321, and is reduced in the dot line portions 211 and 322. Therefore, in the region where the p type ring is formed, the formation area of the p type ring per unit area in the radial direction from the center of the p type ring can be made uniform.

By forming such a p type connection layer 30 and setting the interval between the p type connection layers 30 as described above, it is possible to suppress the equipotential line from excessively rising up in a part of the p type connection layer 30 between the linear portion 31 and the frame portion 32. Thereby, it is possible to suppress the formation of a portion where the electric field concentration occurs between the p type connection layers 30, and it is possible to suppress the reduction in breakdown voltage.

Here, the shape of the upper surface of the linear portion 31 is semicircular at both ends of each linear portion 31 in the longitudinal direction, that is, at both ends of the trench 30a in which the linear portion 31 is formed. The shape of the upper surface at both ends of the trench 30a may be a quadrangular shape. Alternatively, n type layer may be firstly formed at the corner portion, so that the conductive type becomes the n type. Therefore, by making the shape of the upper surface at both ends of each linear portion 31 semicircular, it is possible to eliminate the portion where the n type layer is formed.

Also in the connection portion, the interlayer insulating film 10 is formed on the surface of the n+ type source region 4. The gate pad 40 described above is formed on the interlayer insulation film 10 at the connection portion.

In this way, since the connection portion is arranged between the cell portion and the guard ring portion, and the connection portion is constituted by the plurality of p type connection layers 30 buried in the narrow trench 30a, the thickness of the p type connection layer 30 is not reduced and the p type connection layer 30 is not eliminated. On the other hand, since the p type connection layer 30 is divided into a plurality of parts, there is a possibility that equipotential lines will rise up between the p type connection layers 30. However, by setting the interval between the p type connection layers 30 as described above, excessive rising of the equipotential line can be suppressed, and reduction in breakdown voltage can be suppressed.

With the above structure, the SiC semiconductor device according to the present embodiment is configured. In the SiC semiconductor device configured as described above, when the MOSFET turns on, by controlling the voltage applied to the gate electrode 8, a channel region is formed in the surface portion of the p type base region 3 located on the side surface of the gate trench 6. Thus, a current flows between the source electrode 9 and the drain electrode 11 via the n+ type source region 4 and the n type drift layer 2.

In addition, even when a high voltage is applied at the time the MOSFET turns off, since the p type deep layer 5 is formed to a deeper position than the trench gate structure, entry of an electric field to the bottom of the gate trench 6 is suppressed by the p type deep layer 5, so that the electric field concentration at the bottom of the gate trench is reduced. As a result, breakdown of the gate insulation film 7 is prevented.

In the connection portion, the rising of the equipotential line is suppressed, and the equipotential line is directed toward the guard ring portion side.

Further, in the guard ring portion, the p type guard ring 21 terminates the interval between the equipotential lines while expanding the interval toward the outer circumference direction, so that a required withstand voltage can be obtained even in the guard ring portion. Therefore, a SiC semiconductor device capable of obtaining a required breakdown voltage can be obtained.

Subsequently, a method of manufacturing the SiC semiconductor device according to this embodiment will be described with reference to FIG. 3A to FIG. 3H.

Figure 3A:
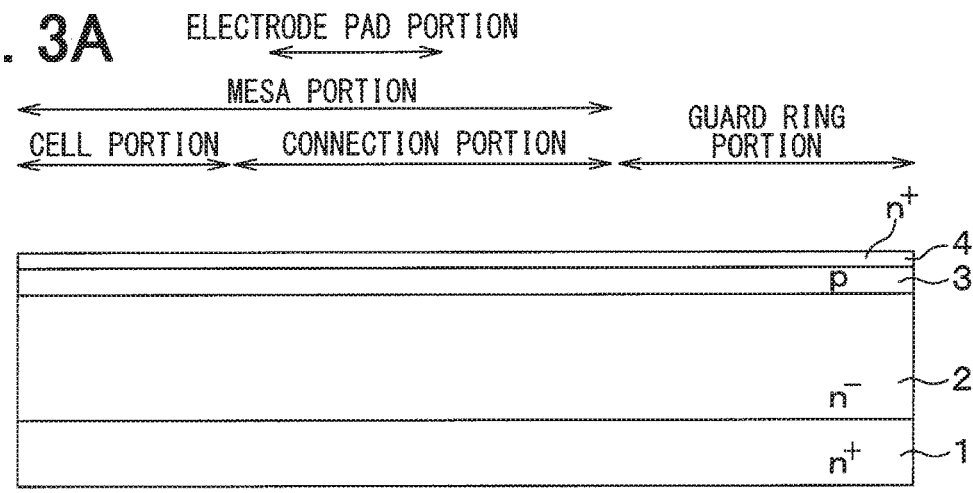
FIG. 3A is a cross-sectional view showing a manufacturing process of a SiC semiconductor device according to the first embodiment.

[Process Shown in FIG. 3A]

First, an n+ type substrate 1 is prepared as a semiconductor substrate. Then, an n− type drift layer 2, a p type base region 3 and an n+ type source region 4 made of SiC are epitaxially grown in this order on the main surface of the n+ type substrate 1.

Figure 3B:
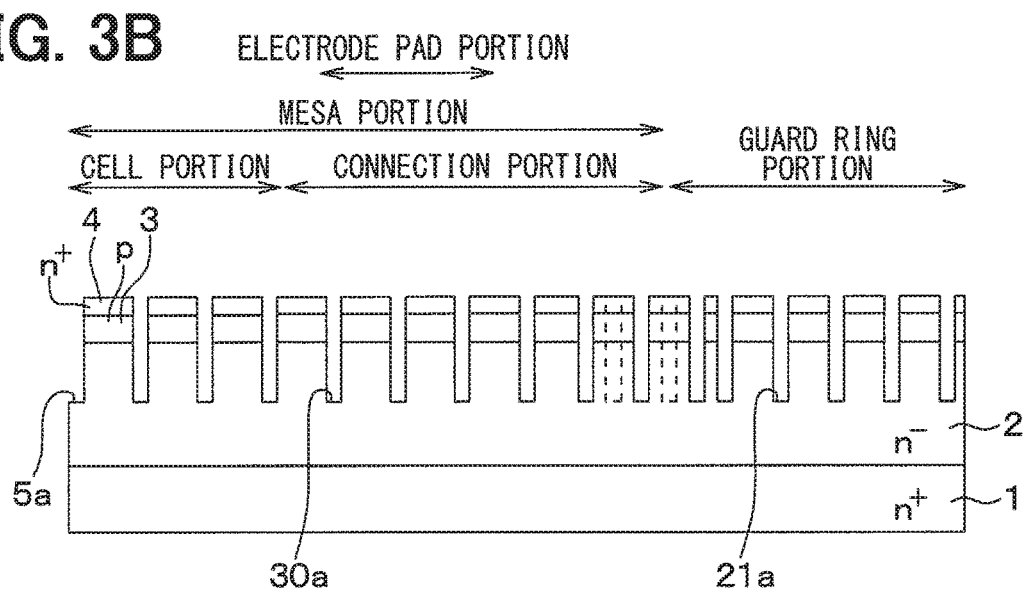
FIG. 3B is a cross-sectional view showing a manufacturing process of the SiC semiconductor device continued from FIG. 3A.

[Process Shown in FIG. 3B]

Next, a mask not shown is placed on the surface of the n+ type source region 4, and regions of the mask, where the p type deep layer 5, the p type guard ring 21 and the p type connection layer 30 are to be formed, are opened. Then, anisotropic etching process such as RIE (Reactive Ion Etching) or the like is performed using a mask to form the trenches 5a, 21a, and 30a. Thus, the trenches 5a, 21a, and 30a are formed in a desired layout, respectively. That is, the trench 21a located on the outer peripheral side is formed in a line shape, and a part of the trenches 21a, 30a located inside of the trench 21a having the line shape is formed to have a layout including the dot line shape.

Figure 3C:
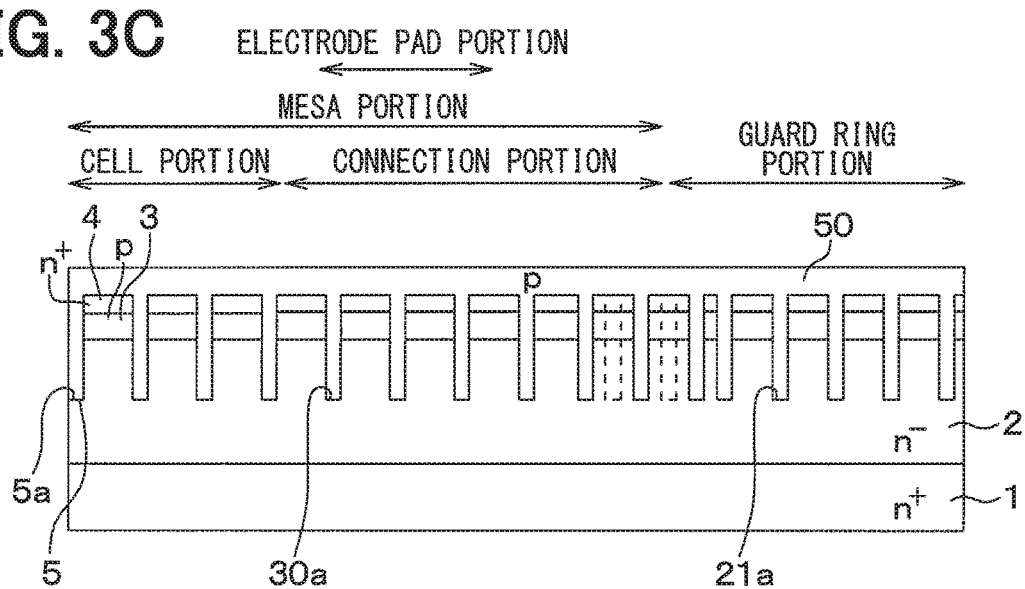
FIG. 3C is a cross-sectional view showing a manufacturing process of the SiC semiconductor device continued from FIG. 3B.

[Process Shown in FIG. 3C]

After removing the mask, the p type layer 50 is formed. At this time, the p type layer 50 is embedded in the trenches 5a, 21a, 30a by the embedding epitaxial process. Since the trenches 5a, 21a, 30a are formed with the line shape having a narrow width, the trenches 5a, 21a 30a are surely filled with the p type layer 50.

Further, as described above, the portion of the frame portion 32 and the portion of the p type guard ring 21 which is disposed at the boundary position of the concave portion 20 is defined as the dot line portions 211 and 322, and the interval between the adjacent dot line portions 211 and 322 is set to be smaller than the interval between the p type deep layers 5 and the interval between the ring portions 212. Therefore, it is possible to equalize the area of the p type layer per unit area in the radial direction from the center of the frame portion 32 and the p type guard ring 21 to the outer peripheral side. Therefore, at the connection portion, while forming the connection layer 30 so that the rising of the equipotential line is suppressed, the thickness of the p type layer 50 formed on the cell portion, the connection portion, and the guard ring portion is made uniform.

Figure 3D:
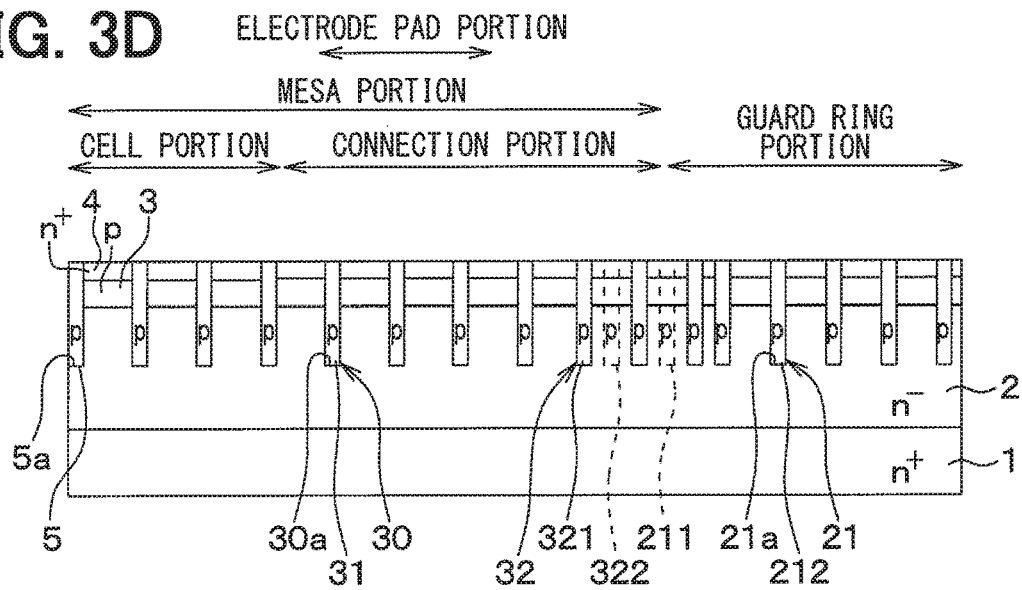
FIG. 3D is a cross-sectional view showing a manufacturing process of the SiC semiconductor device continued from FIG. 3C.

[Process Shown in FIG. 3D]

An etch back process is performed by the dry etching method to remove a part of the p type layer 50 formed above the surface of the n+ type source region 4. Thereby, the p type deep layer 5, the p type guard ring 21 and the p type connection layer 30 are formed.

At this time, as described above, the thicknesses of the p type layers 50 formed on the cell portion, the connection portion and the guard ring portion are substantially equal to each other. Therefore, by removing the p type layer 50 in the cell portion at the time of etch back, it becomes possible to remove the p type layer 50 without leaving any residue in the connection portion and the guard ring portion. Therefore, it is possible to prevent the p type layer 50 from remaining as a residue in the guard ring portion as in the case where the thickness of the p type layer 50 on the guard ring portion is thicker than other portions.

Figure 3E:
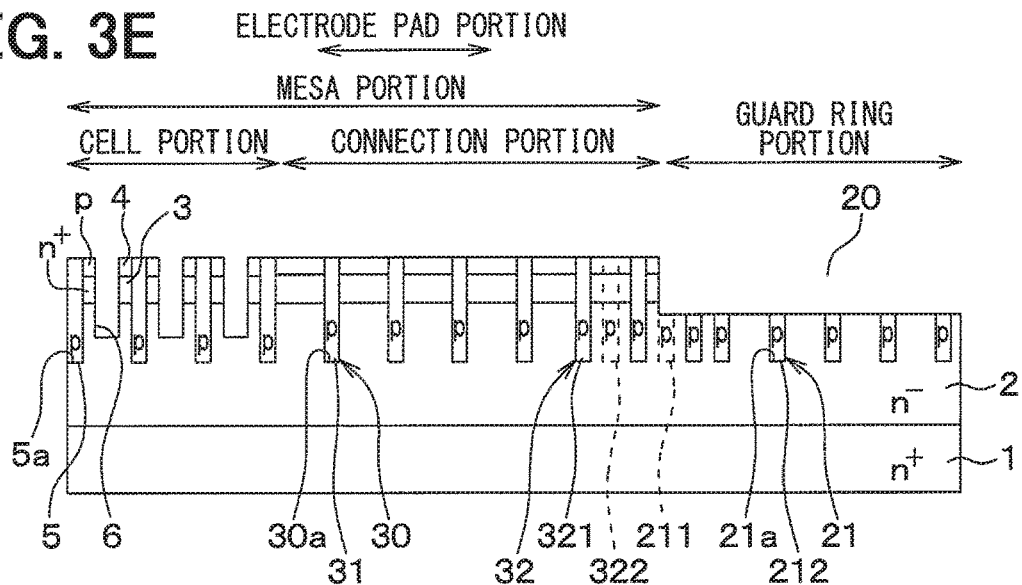
FIG. 3E is a cross-sectional view showing a manufacturing process of the SiC semiconductor device continued from FIG. 3D.

[Process Shown in FIG. 3E]

A mask not shown is formed on the n+ type source region 4 and the like, and then a region of the mask where the gate trench 6 is to be formed is opened. Then, the gate trench 6 is formed by performing anisotropic etching process such as RIE using a mask.

Further, after removing the mask, a mask not shown is formed again, and an area of the mask in which the concave portion 20 is to be formed is opened. Then, the concave portion 20 is formed by performing an anisotropic etching process such as RIE using a mask. As a result, the n− type drift layer 2 is exposed through the n+ type source region 4 and the p type base region 3 at the position where the concave portion 20 is formed, and a plurality of the p type guard rings 21 are arranged on the surface portion of the n− type drift layer 2.

Here, the concave portion 20 of the gate trench 6 is formed in a separate process using different masks. Alternatively, the concave portion 20 may be formed simultaneously using the same mask.

Figure 3F:
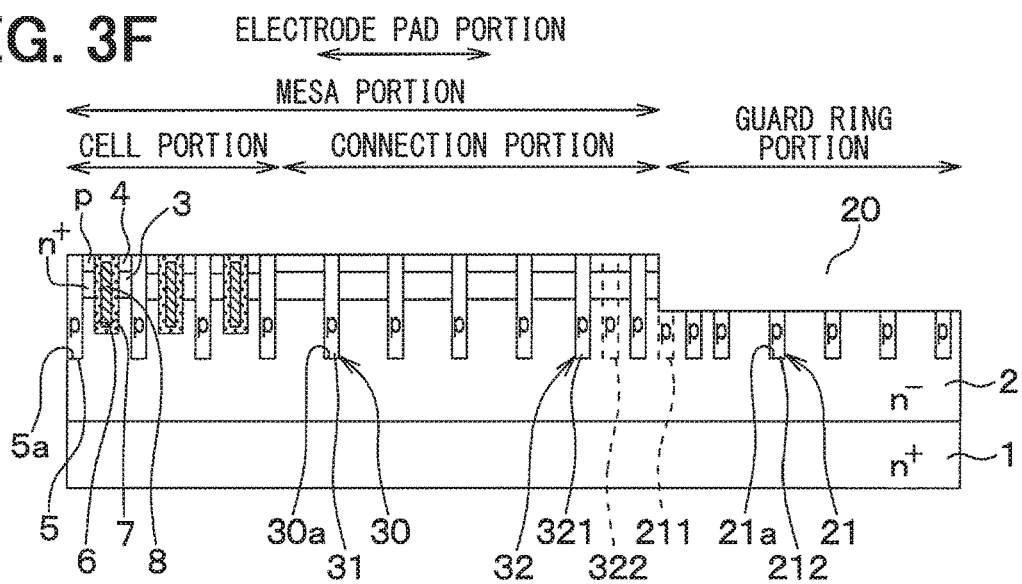
FIG. 3F is a cross-sectional view showing a manufacturing process of the SiC semiconductor device continued from FIG. 3E.

[Process Shown in FIG. 3F]

After removing the mask, for example, thermal oxidation is performed to form the gate insulation film 7, and the gate insulation film 7 covers the inner wall surface of the gate trench 6 and the surface of the $n^+$ type source region 4. Then, after depositing Poly-Si doped with a p type impurity or an n type impurity, the Poly-Si material is etched back to leave the Poly-Si material in at least the gate trench 6, thereby forming the gate electrode 8.

Figure 3G:
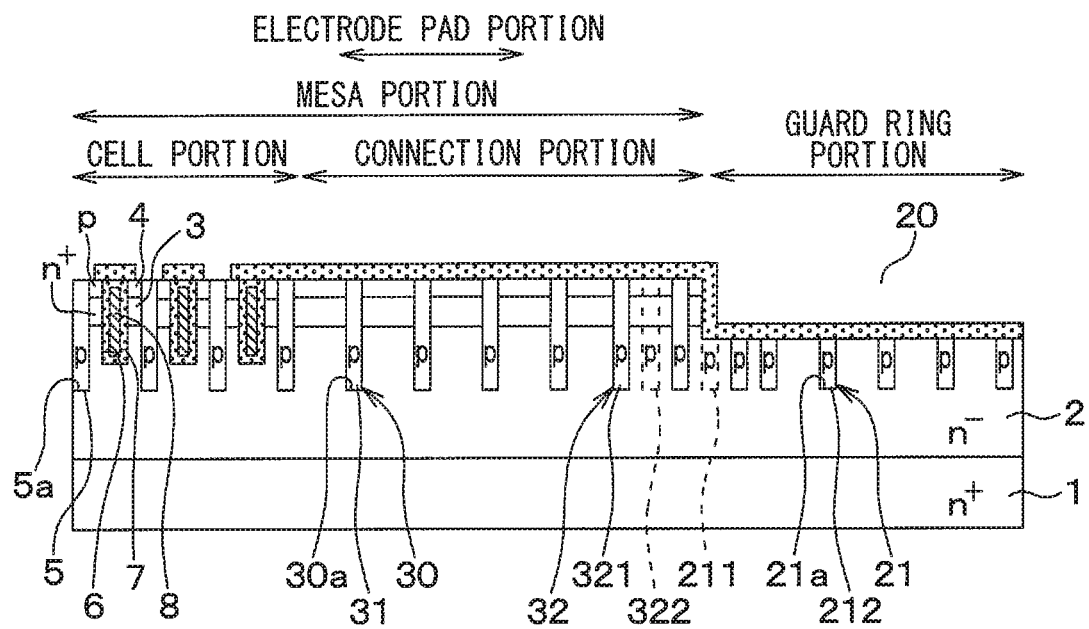
FIG. 3G is a cross-sectional view showing a manufacturing process of the SiC semiconductor device continued from FIG. 3F.

[Process Shown in FIG. 3G]

An interlayer insulation film 10 made of, for example, an oxide film or the like is formed so as to cover the surfaces of the gate electrode 8 and the gate insulation film 7. Then, after forming a mask not shown on the surface of the interlayer insulation film 10, a portion of the mask located between the gate electrodes 8, that is, a portion corresponding to the p type deep layer 5 and their vicinity is opened. Thereafter, a contact hole for exposing the p type deep layer 5 and the $n^+$ type source region 4 is formed by patterning the interlayer insulation film 10 using a mask.

Figure 3H:
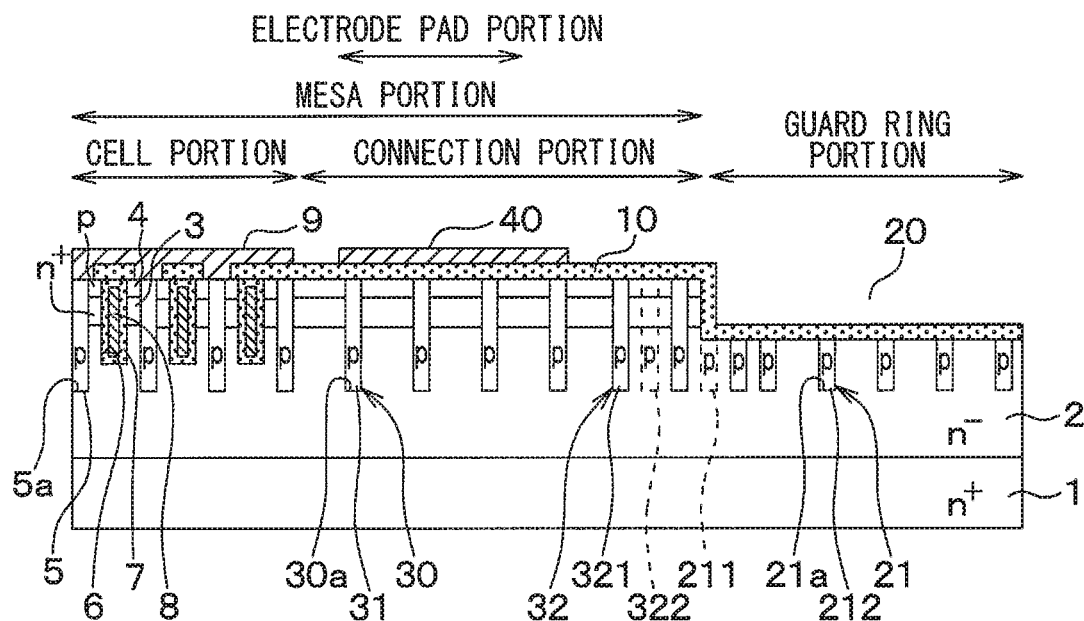
FIG. 3H is a cross-sectional view showing a manufacturing process of the SiC semiconductor device continued from FIG. 3G.

[Step Shown in FIG. 3H]

An electrode material constituted by, for example, a laminated structure of a plurality of metals is formed on the surface of the interlayer insulation film 10. Then, by patterning the electrode material, the source electrode 9 and the gate pad 40 are formed. Here, a gate lead-out portion connected to the gate electrode 8 of each cell is arranged in a cross section different from that in this drawing. A contact hole is formed in the interlayer insulation film 10 at the lead-out portion, so that the gate pad 40 and the gate electrode 8 are electrically connected.

Although not shown in the following process, the SiC semiconductor device according to the present embodiment is completed by performing a process such as forming the drain electrode 11 on the back side of the $n^+$ type substrate 1.

Subsequently, effects of the SiC semiconductor device and the manufacturing method thereof according to the present embodiment will be described.

Before describing the effect, a consideration and the like of the present inventors up to the SiC semiconductor device and the manufacturing method thereof according to this embodiment will be described.

Figure 4:
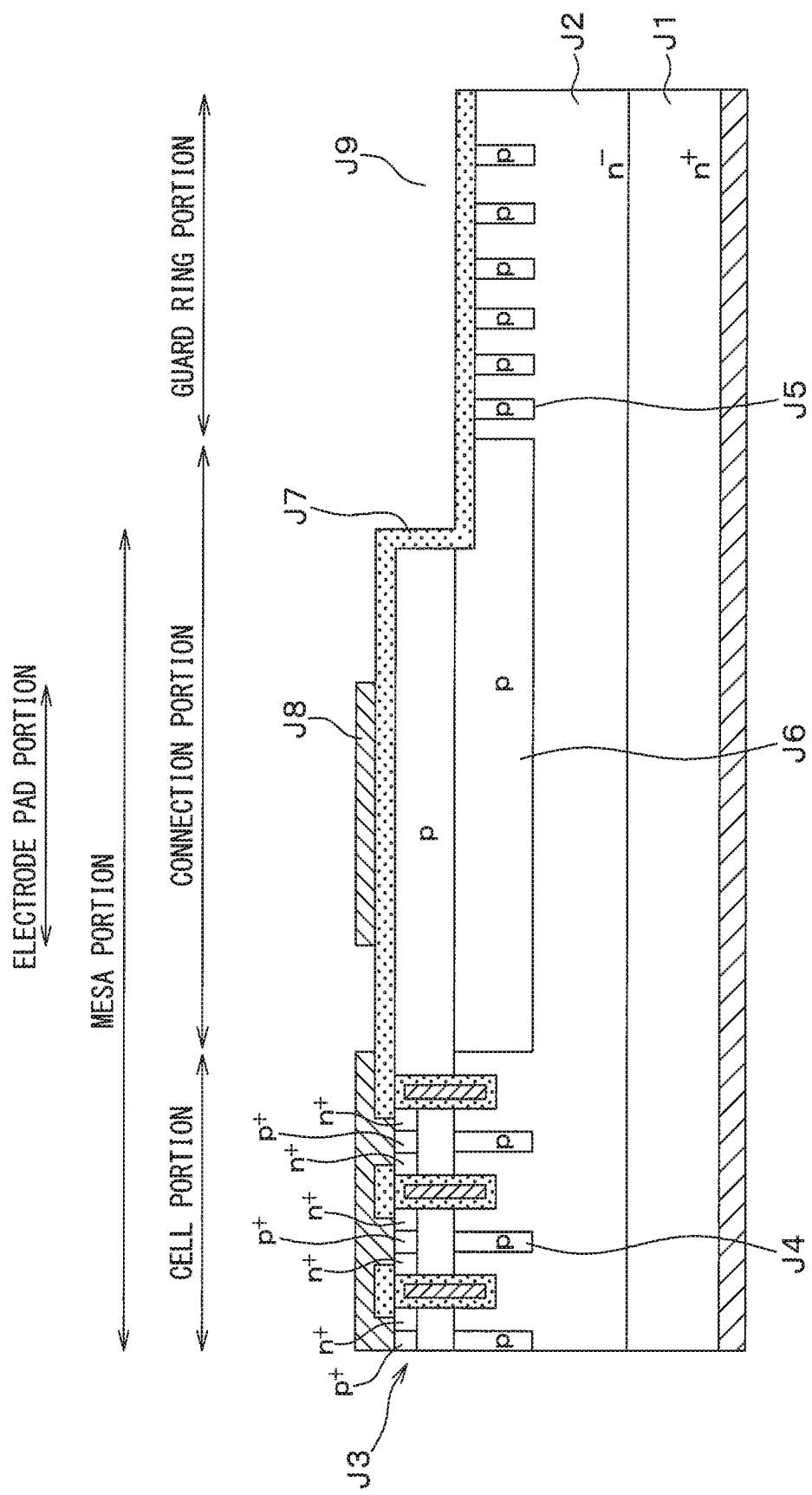
FIG. 4 is a cross-sectional view of a SiC semiconductor device studied by the present inventors.

First, the inventors of the present disclosure consider a structure such that the connection portion is arranged between cell portion and the guard ring portion, and the concave portion is formed in an outer peripheral region including the guard ring portion, and the mesa portion is provided by protruding the cell portion and the connection portion with an island shape. For example, the structure shown in FIG. 4 is considered.

As shown in the drawing, using a semiconductor substrate in which an $n^-$ type drift layer 32 is formed on an $n^+$ type SiC substrate 31, a cell portion, in which a power element 33 constituted by a MOSFET or the like is formed, and a guard ring portion are formed. A plurality of p type deep layers 34 for improving the withstand voltage of the power device 33 are formed in a stripe shape in the cell portion, and a p type guard ring 35 constituted by a p type layer is formed in the guard ring portion with a frame shape. Then, a connection portion is arranged between the cell portion and the guard ring portion, and a p type connection layer 36 for electric field relaxation is formed in the connection portion so that the equipotential line does not terminate at the connection portion, and the electric field concentration is suppressed. Further, in this connection portion, an electrode pad portion, in which the electrode pad 38 is arranged on the interlayer insulation film 37 formed on the front surface side of the semiconductor substrate, is arranged, and at a desired portion of the power element 33, for example, an electric connection between the gate electrode and an external device is made.

Further, a concave portion 39 is formed in the guard ring portion so that the surface of the $n^-$ type drift layer J2 is exposed, and the interlayer insulation film 37 is formed thereon. In the thickness direction of the $n^+$ type SiC substrate 31, a mesa portion is prepared by protruding the inner portion of the concave portion 39 from the guard ring portion.

In such a structure, with respect to the p type deep layer 34, the p type connection layer 36 and the p type guard ring 35, a p type impurity is ion implanted in the $n^-$ type drift layer 32 so that they are formed.

However, SiC has a short implantation range in the ion implantation process, and therefore, it is difficult to perform the ion implantation to a deep position. In order to form the p type deep layer 34, the p type connection layer 36 and the p type guard ring 35 to a deep position, it is necessary to constitute these by an epitaxial film in the epitaxial growth process rather than the ion implantation process. That is, after embedding the epitaxial film in the trench, the epitaxial film outside the trench is removed by the etch back process to form the p type deep layer 34, the p type connection layer 36 and the p type guard ring 35.

However, in the case of using the epitaxial film, the width of the p type connection layer 36 is larger than the narrow width such as the p type deep layer 34 and the p type guard ring 35, so a difficulty arises such that the thickness of the p type connection layer 36 is thinner, and a region where the p type connection layer 36 is eliminated is formed. For this reason, it was impossible to obtain a withstand voltage required for a power device.

In order to prevent this difficulty, the present inventors investigate to construct the p type connection layer 36 without widening a width but with providing a narrow width having the same width as the p type deep layer 34 and the p type guard ring 35. In this way, when the width of the p type connection layer 36 is narrowed, it is possible to appropriately embed the epitaxial film in the trench for constructing the p type connection layer 36. In the guard ring portion, however, it is desirable to increase the interval of the p type guard rings 35 toward the outer periphery so that the electric field concentration is relaxed and the equipotential line is directed to the outer peripheral side of the cell portion. As for the p type connection layer 36, preferably, the interval between the p type connection layers 36 may be made narrower than the interval between the p type deep layers 34 and the interval between the p type guard rings 35 so that the effects of electric field relaxation can more reliably be accomplished.

However, when such a spacing design is carried out, it is confirmed that the film thickness may vary when the epitaxial film is formed to provide the p type deep layer 34, the p type connection layer 36 and the p type guard ring 35.

Figure 5A:
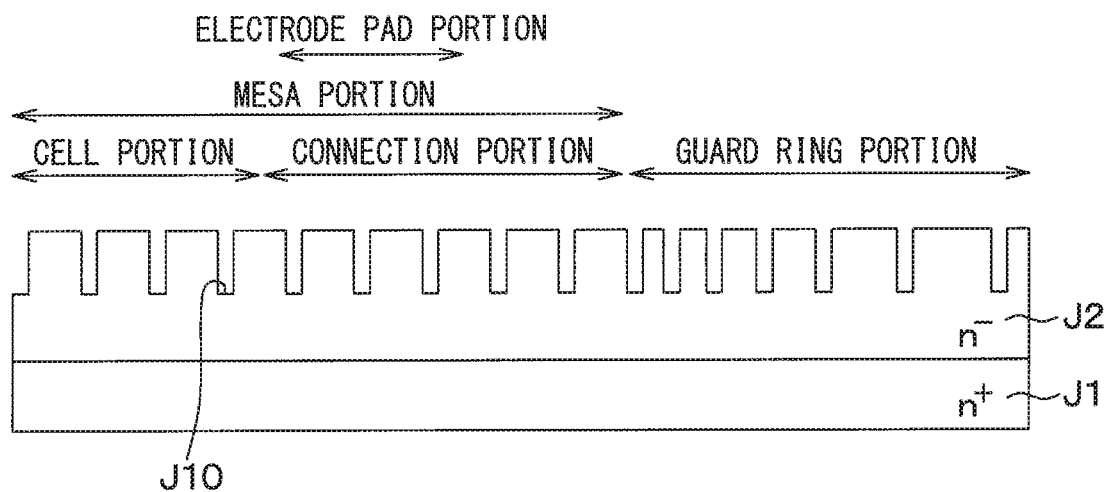
FIG. 5A is a cross-sectional view of a SiC semiconductor device during the manufacturing process, which the present inventors have studied.
Figure 5B:
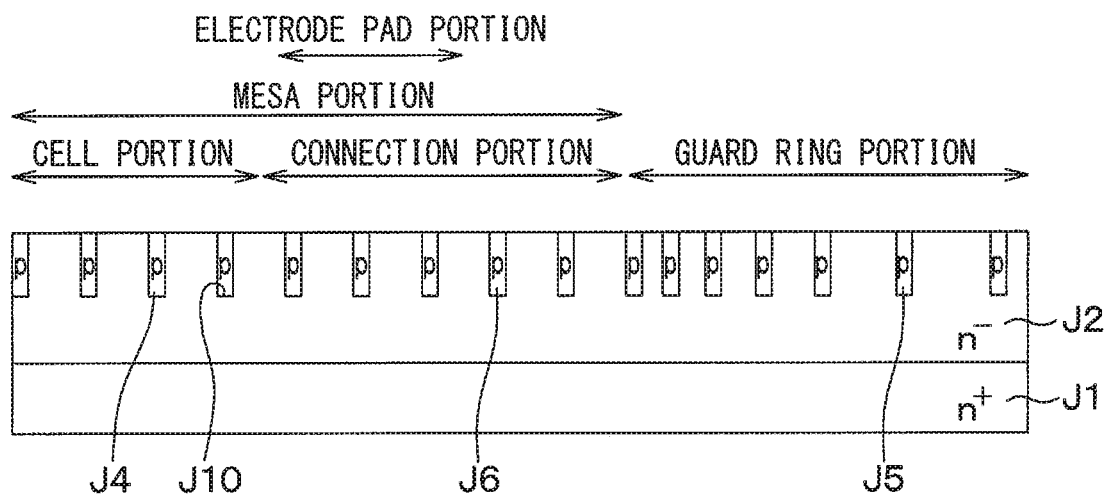
FIG. 5B is a cross-sectional view showing a manufacturing process of the SiC semiconductor device continued from FIG. 5A.

Specifically, first, as shown in FIG. 5A, a trench 310 is formed in the $n^-$ type drift layer 32. Thereafter, the inside of the trench 310 is filled with an epitaxial film, and then the epitaxial film is etched back to form a p type deep layer 34, a p type connection layer 36 and a p type guard ring 35. Ideally, as shown in FIG. 5B, preferably, in addition to the n⁻ type drift layer 32, the surfaces of the p type deep layer 34, the p type connection layer 36 and the p type guard ring 35 are disposed on the same plane.

Figure 5C:
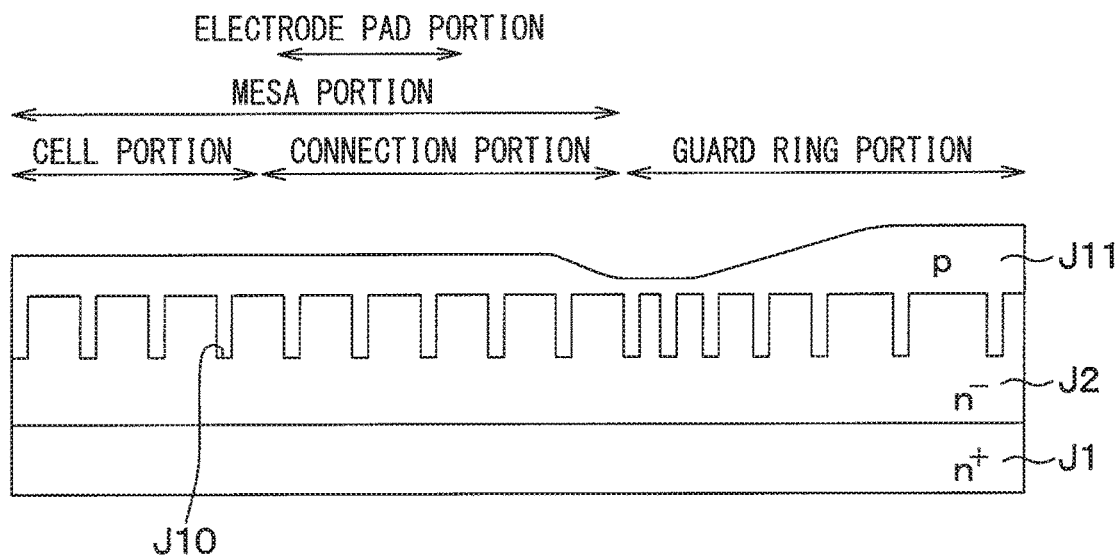
FIG. 5C is a cross-sectional view showing a manufacturing process of the SiC semiconductor device continued from FIG. 5B.
Figure 5D:
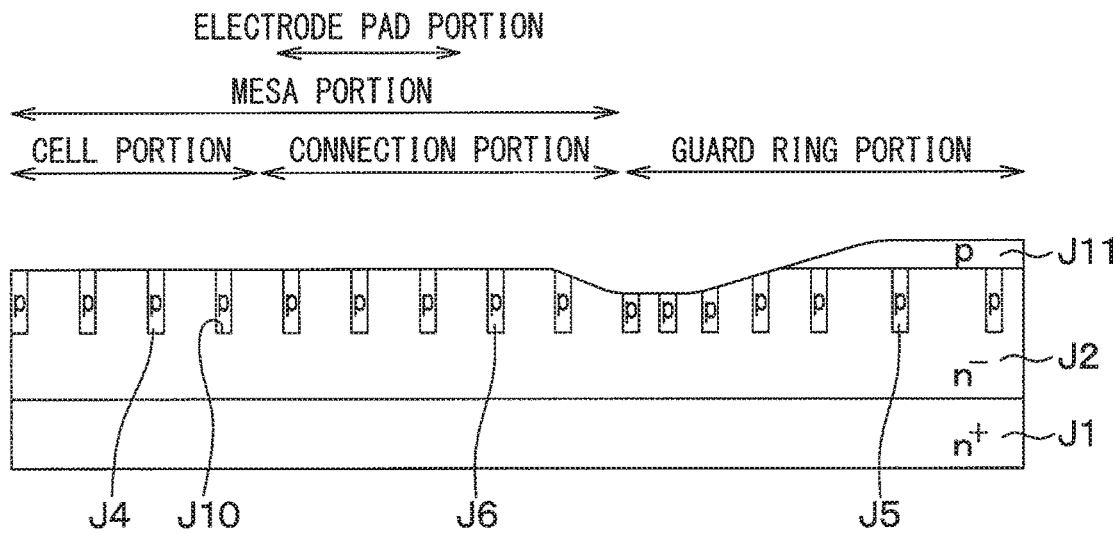
FIG. 5D is a cross-sectional view showing a manufacturing process of the SiC semiconductor device continued from FIG. 5C.

However, in the guard ring portion, when the interval of the p type guard ring 35 gradually increases toward the outer periphery, as shown in FIG. 5C, in the guard ring portion, the trench 310 becomes sparse and the film thickness of the epitaxial film 311 becomes larger than the other parts. Therefore, as shown in FIG. 5D, when the epitaxial film is etched back, the epitaxial film 311 may remain as residue in the guard ring portion. Therefore, the function as the guard ring portion cannot be obtained, and electric field relaxation cannot be performed, so that the device breakdown voltage may be reduced. If the amount of etch-back process is increased, the residue can be removed. In that case, the n⁻ type drift layer 32, the p type deep layer 34 and the p type connection layer 36 are thinned in the cell portion and the withstand voltage may be decreased. Therefore, there is a possibility that it becomes impossible to obtain the withstand voltage required for the power device.

Further, in the case where the interval between the p type connection layers 36 is narrower than the interval between the p type deep layers 34 and the interval between the p type guard rings 35, the trench 310 becomes dense at the connection portion, and the film thickness of the epitaxial film 311 becomes thinner than other parts. For this reason, when the film is etched back, the same etching amount is removed from the surface, so that the connection portion has a recessed shape. In this case, if the etch-back amount is increased in order to remove the residue in the guard ring portion, the n⁻ type drift layer 32 and the p type connection layer 36 are further thinned at the connection portion, and therefore, a possibility of decreasing the break down voltage may be increased.

Therefore, in the present embodiment, portions of the frame portion 32 and the p type guard ring 21 closer to the cell portion side than the other portion are narrowed in a width, and the interval therebetween is the dot line portion 211, 322.

In this way, narrowing the interval between the frame portion 32 and the interval between the p type guard ring 21 on the side of the cell portion are narrowed, so that the electric field concentration on the cell portion side is relaxed, and the equipotential line is directed toward the outer periphery side. Further, by designing parts of the frame portion 32 and the p type guard ring 21 on the cell portion side to be the dot line portions 211, 322, the difference of the formation areas between the trenches 5a, 21a, 30a per unit area is reduced in the cell portion, the connection portion and the guard ring portion. Therefore, when forming the p type layer 50, the difference in the amount of the p type layer 50 filling the trench per unit area also decreases. This makes it possible to equalize the thicknesses of the p type layers 50 formed on the cell portion, the connection portion and the guard ring portion. Therefore, when the p type layer 50 is etched back, it is possible to prevent the p type layer 50 from remaining as a residue in the guard ring portion, and it is possible to ensure the withstanding voltage required for the power device.

Furthermore, when the boundary position of the concave portion 20 of the frame shaped portion 32 and the p type guard ring 21 is disposed at the dot line portions 211 and 322, the formation position deviation of the concave portion 20 due to the mask misalignment, that is, the defect due to the formation position misalignment of the mesa portion can be suppressed. This reason will be explained.

The frame shaped portion 32 should be formed in the mesa portion which is originally disposed at the inner peripheral side of the concave portion 20. Likewise, the p type guard ring 21 should also be formed in the guard ring portion originally in the concave portion 20.

Figure 6A:
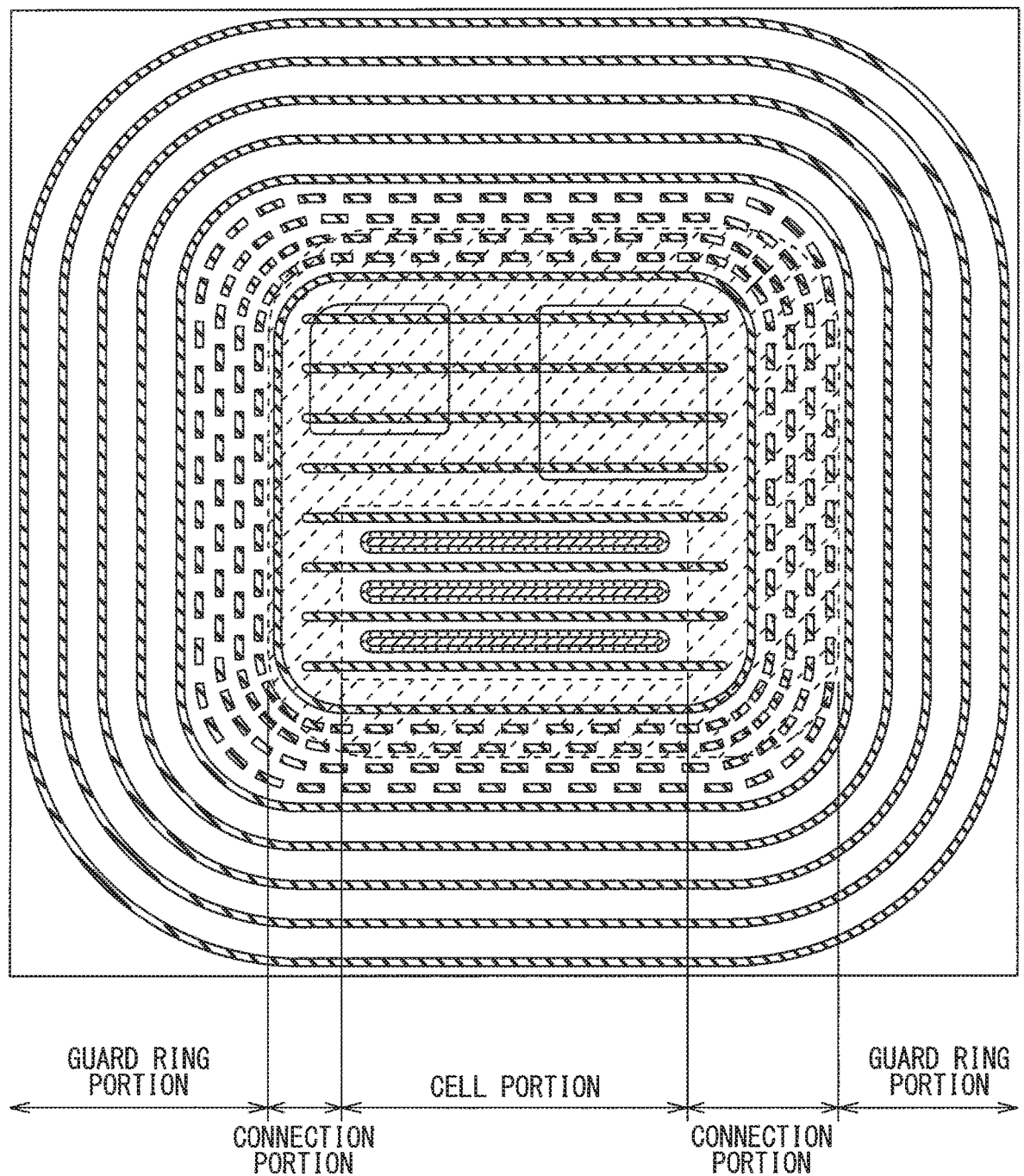
FIG. 6A is a diagram showing a top layout of a SiC semiconductor device when a mask deviation occurs.

However, when the misalignment of the formation of the concave portion 20 occurs, as shown in FIG. 6A, a part of the frame shaped portion 32 is positioned within the concave portion 20, so that the part is formed so as to protrude into the guard ring portion. In addition, a part of the p type guard ring 21 is located on the inner peripheral side of the concave portion 20, so that the part protrudes into the mesa portion.

Figure 6B:
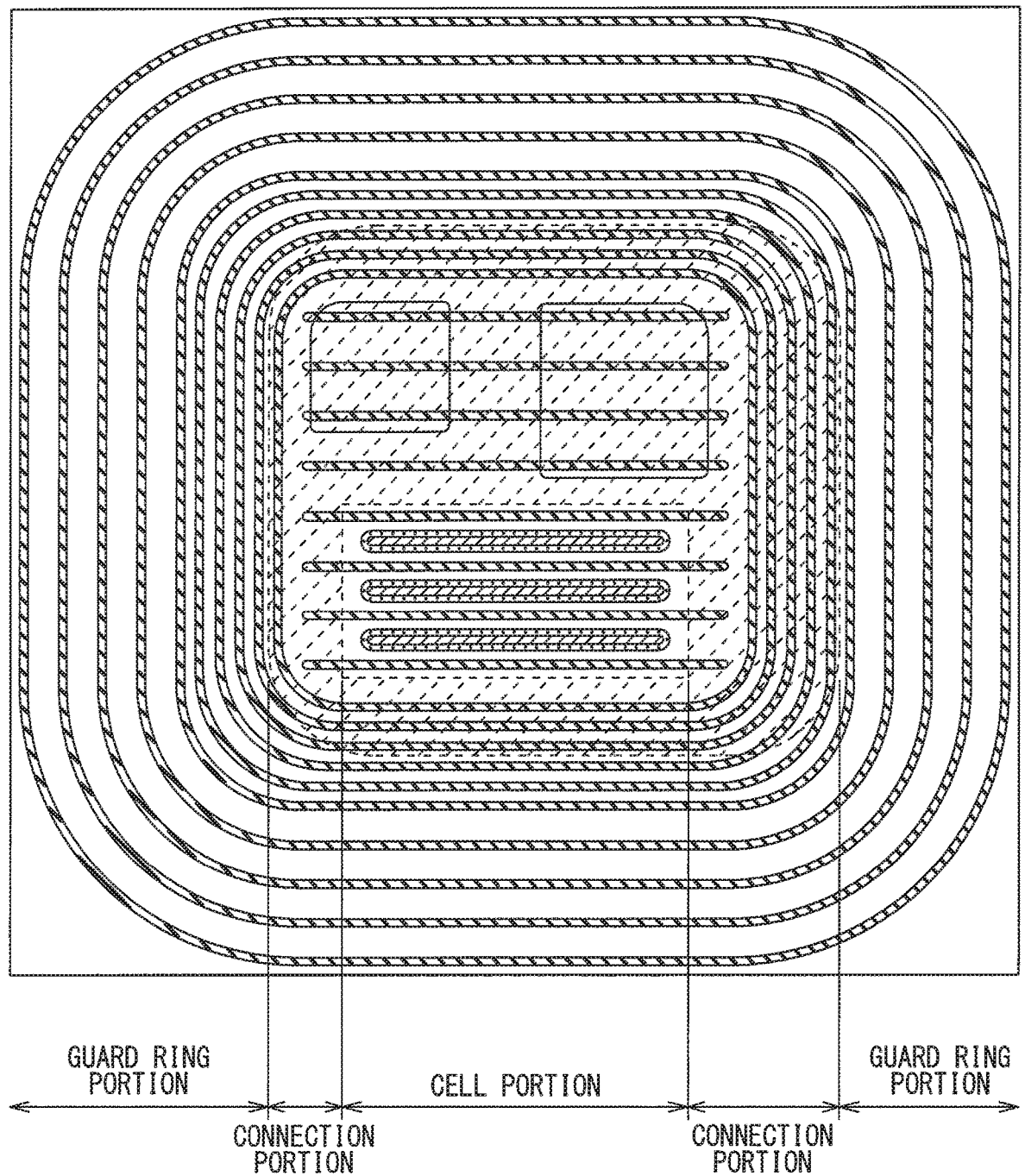
FIG. 6B is a diagram showing a top layout in a case where the frame portion of the p type connection layer and the p type guard ring are all formed in a line shape in the case where mask displacement occurs.

Here, the frame portion 32 is connected to the p type base region 3 to have a source potential. In addition, the p type guard ring 21 is formed in the concave portion 20 from which the p type base region 3 and the like have been removed, and is set to be, for example, a floating state without being set to the source potential. However, as shown in FIG. 6B, if parts of the frame shaped portion 32 and the p type guard ring 21 located in the vicinity of the boundary position of the concave portion 20 are formed in a continuous line shape instead of a dot line shape, due to the misalignment of the forming position of the concave portion 20, they are both connected to the p type base region 3 and become the source potential. For this reason, there is a portion of the guard ring portion to be the source potential, and therefore, a difficulty arises such that breakdown voltage cannot be secured.

On the other hand, in the case of the present embodiment, the frame portion 32 and the p type guard ring 21 are constituted by the dot line portions 211 and 322 in the portion to be the boundary position of the concave portion 20. Therefore, even if the misalignment of the formation position of the concave portion 20 occurs due to the mask deviation, each dot constituting the dot line portions 211 and 322 is electrically separated from each other, and it is possible to restricts a part that becomes the source potential from protruding into the guard ring portion. Therefore, it is possible to secure a withstand voltage.

Figure 7A:
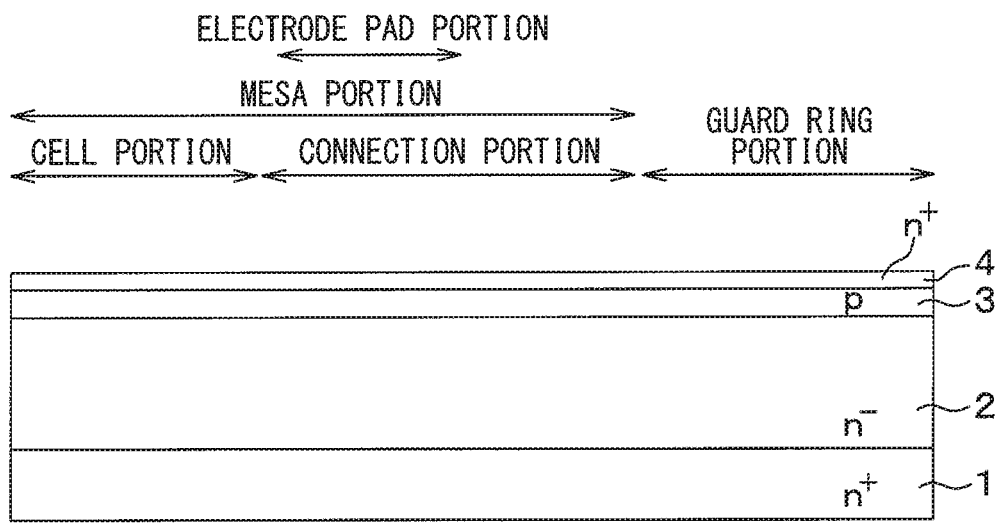
FIG. 7A is a cross-sectional view showing a state during a manufacturing process when the width of the connection layer is increased as a reference example.
Figure 7B:
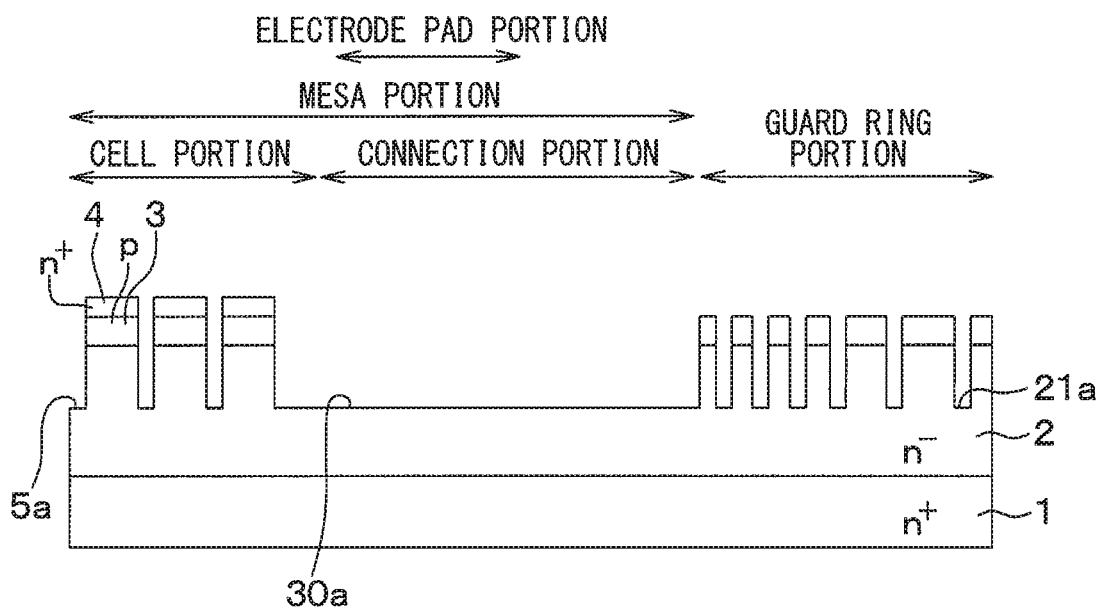
FIG. 7B is a cross-sectional view showing a manufacturing process of the SiC semiconductor device continued from FIG. 7A.
Figure 7C:
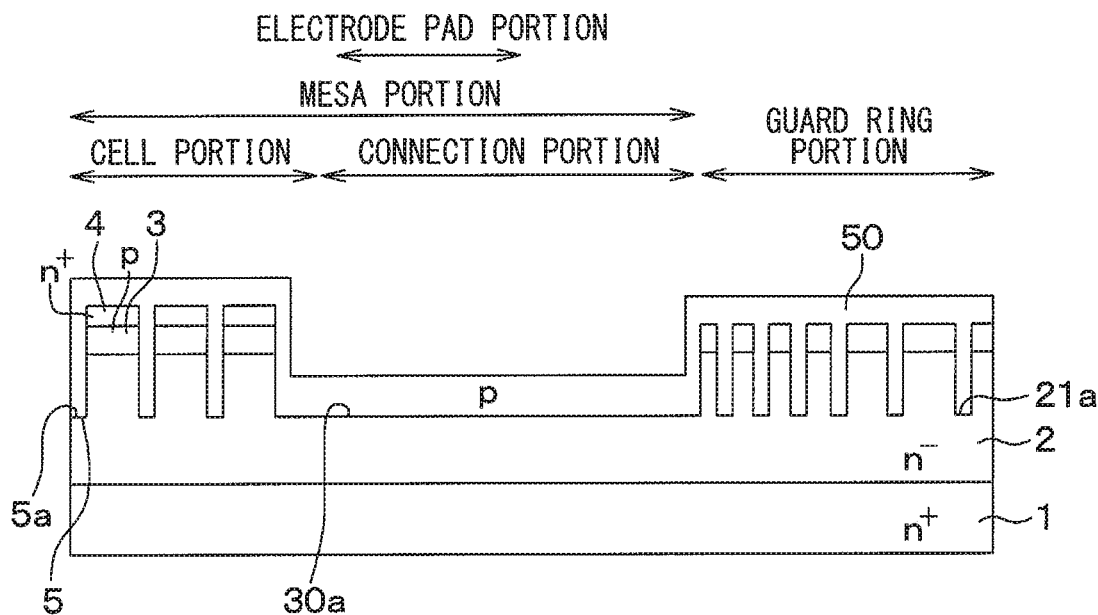
FIG. 7C is a cross-sectional view showing a manufacturing process of the SiC semiconductor device continued from FIG. 7B.
Figure 7D:
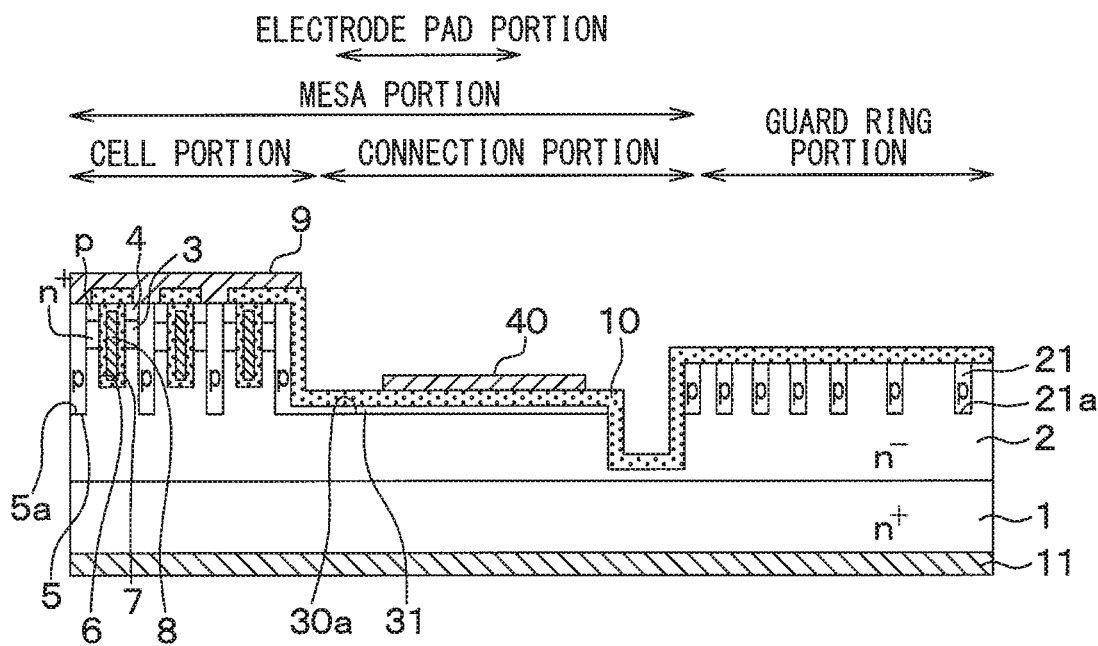
FIG. 7D is a cross-sectional view showing a manufacturing process of the SiC semiconductor device continued from FIG. 7C.

For reference, when using the epitaxial film, when the width of the p type connection layer 30 is made larger than those of the p type deep layer 5 and the p type guard ring 21, a feature such that the thickness of the p type connection layer 30 becomes thinner and an area where the p type connection layer 30 is eliminated is generated will be described with reference to the drawings. FIGS. 7A to 7D show a manufacturing process in the case where the entire region between the cell portion and the guard ring portion is formed as the p type connection layer 30 without narrowing the width of the p type connection layer 30. The steps shown in FIGS. 7A and 7B are performed similar to the steps in FIGS. 3A and 3B. At this time, the width of the trench 30a is set to be the width corresponding to the entire region from the cell portion to the guard ring portion. In the step of FIG. 7C, when the p type layer 50 is deposited in the same manner as in FIG. 3C, since the width of the trench 30a is large, the thickness of the portion of the p type layer 50 constituting the p type connection layer 30 becomes thin. Thereafter, when the p type layer 50 is etched back, the thickness of the connection layer 30 becomes thin, and the p type layer 50 remains only at the bottom of the trench 30a. Further, when etching is performed using a mask not shown which has an opening at the guard ring portion while covering the mesa portion, the connection layer 30 is completely eliminated on the outer peripheral side from the mesa portion, and further the n⁻ type drift layer 2 is etched. Therefore, as shown in FIG. 7D, in the region where the mesa portion is to be formed, the connection layer 30 becomes thin and the connection layer 30 does not exist in the region outside the mesa portion. Therefore, by narrowing the width of the connection layer 30 as in the present embodiment, it is possible to solve the difficulty such as thinning of the connection layer 30. Therefore, it is possible to secure the withstand voltage required for the power device.

Second Embodiment

A second embodiment will be described. This embodiment is a modification of the structure of the p type deep layer 5 and the like with respect to the first embodiment, and other features are similar to the first embodiment, so only the parts different from the first embodiment will be explained.

Figure 8:
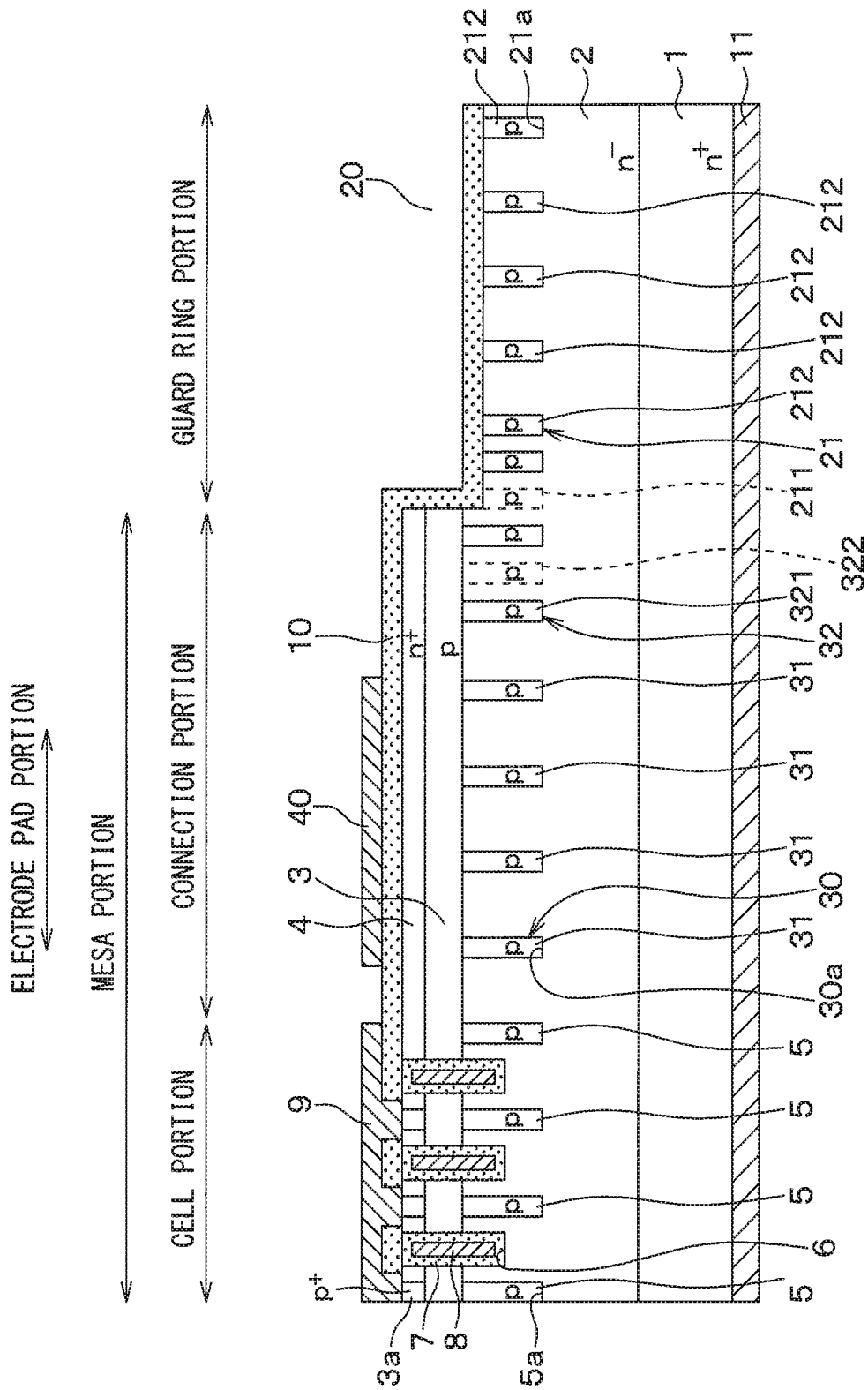
FIG. 8 is a cross-sectional view of a SiC semiconductor device according to a third embodiment.

As shown in FIG. 8, in the present embodiment, the dimensions such as the widths of the p type deep layer 5, the p type connection layer 30 and the p type guard ring 21 and the interval between the respective parts and the like are the same as in the first embodiment, but the p type deep layer 5 and the p type connection layer 30 are formed only under the p type base region 3. Then, in order to electrically connect the p type base region 3 and the source electrode 9, ion implantation is performed to the $n^+$ type source region 4 so that the p+ type contact portion 3a is formed. As a result, the p+ type contact portion 3a is electrically connected to the source electrode 9, and the potentials of the p type deep layer 5 and the p type connection layer 30 becomes the source potential through the p type base region 3. Even with such a structure, the same effect as in the first embodiment can be obtained.

Basically, the method for manufacturing the SiC semiconductor device having such a structure is the same as in the first embodiment, but after forming the trenches 5a, 21a, 30a in the $n^-$ type drift layer 2, and before forming the p type base region 3, the p type layer 50 is formed and the etching back is performed. Thereby, the p type deep layer 5, the p type connection layer 30 and the p type guard ring 21 are formed. At this time, as in the first embodiment, the thicknesses of the p type layer 50 can be made substantially equal in the cell portion, the connection portion and the guard ring portion. Therefore, when the p type layer 50 is etched back, it is possible to prevent the p type layer 50 from remaining as a residue.

Further, after forming the $n^+$ type source region 4, ion implantation of p type impurity is performed at a position corresponding to the p type deep layer 5 in the $n^+$ type source region 4 using a mask not shown, so that a step for forming the p+ type contact portion 3a is carried out. The other steps are the same as those in the first embodiment.

Third Embodiment

A third embodiment will be described. In this embodiment, a junction barrier Schottky diode (hereinafter referred to as JBS) is provided instead of the vertical MOSFET as the power element in the first embodiment. Since the others are the same as those in the first embodiment, only the parts different from the first embodiment will be described.

Figure 9:
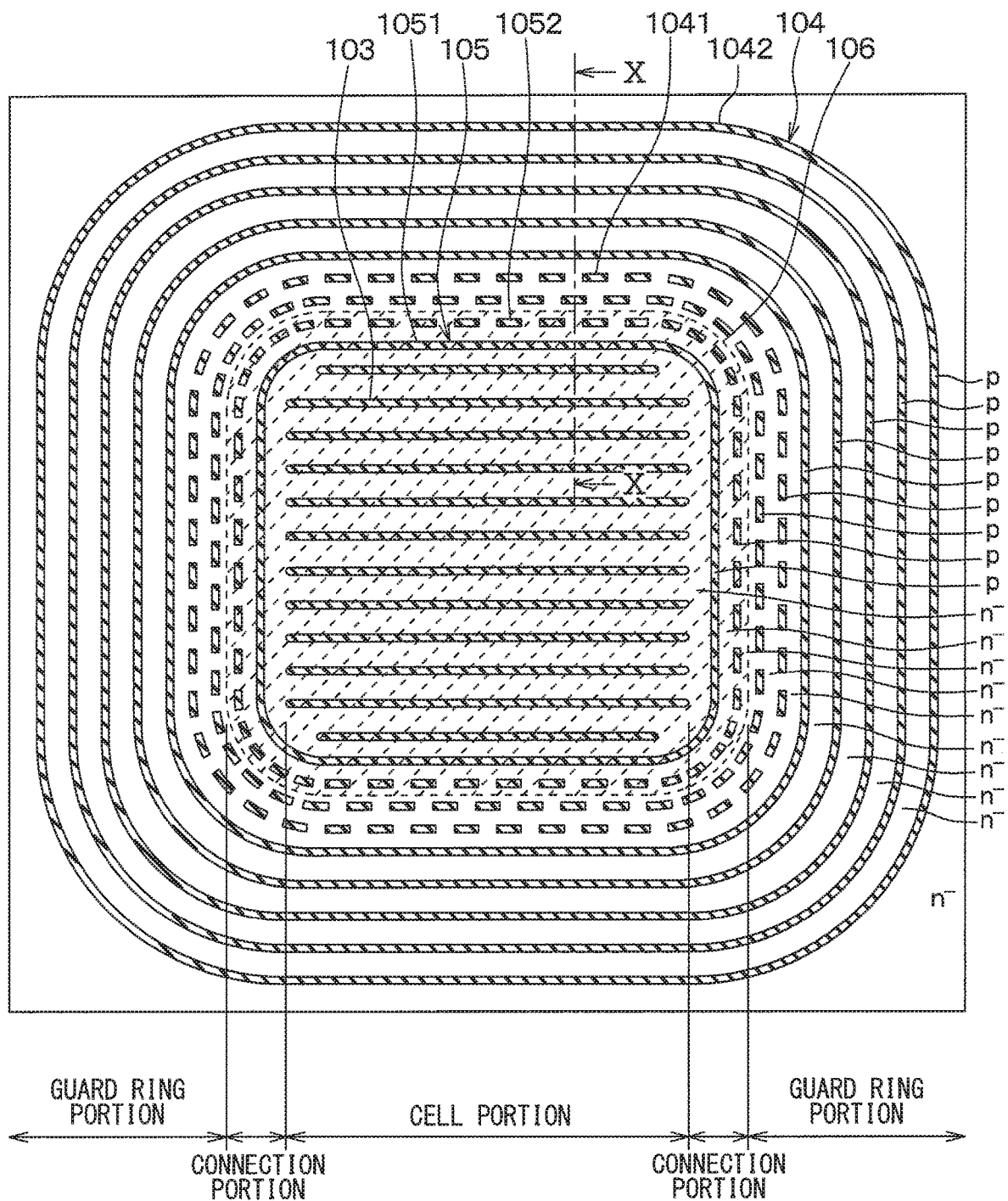
FIG. 9 is a diagram schematically showing a top layout of a SiC semiconductor device according to a third embodiment.
Figure 10:
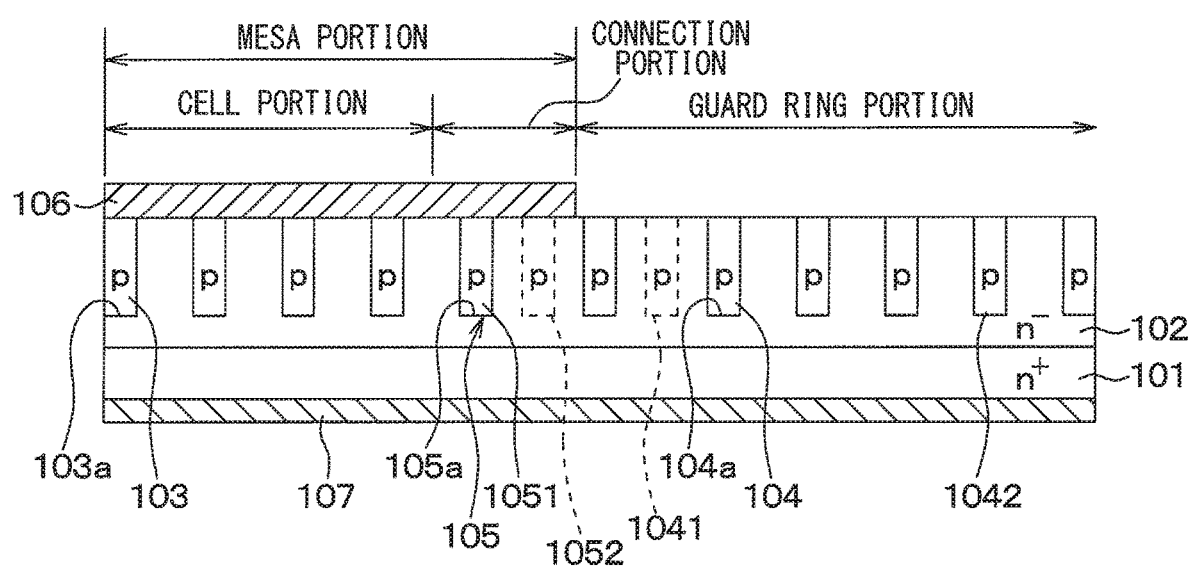
FIG. 10 is a cross-sectional view taken along the line X-X in FIG. 9.

The SiC semiconductor device according to this embodiment will be described with reference to FIGS. 9 and 10. As shown in FIG. 10, an $n^-$ type drift layer 102 is formed on an $n^+$ type substrate 101. As shown in FIGS. 9 and 10, in the cell portion, a stripe-shaped p type deep layer 103 is formed with respect to the $n^-$ type drift layer 102, and in the guard ring portion surrounding the p type deep layer 103, the p type guard ring 104 is formed. In addition, a p type connection layer 105 is also formed at the connection portion between the cell portion and the guard ring portion.

The p type deep layer 103 is disposed in each of a plurality of stripe-shaped trenches 103a which are arranged at equal intervals in the $n^-$ type drift layer 102, and the deep layer 103 is made of a p type epitaxial film by epitaxial growth. The trench 103a corresponds to a deep trench, and has a depth of, for example, 1 micrometer or less and an aspect ratio of 2 or more. In addition, the tip of the p type deep layer 103 has a semicircular top shape.

The p type guard ring 104 is disposed in the trench 104a formed in the $n^-$ type drift layer 102, and is made of a p type epitaxial film by epitaxial growth. The trench 104a corresponds to a guard ring trench, and has a depth of, for example, 1 micrometer or less and an aspect ratio of 2 or more. In the case of the present embodiment, the portion of the p type guard ring 104 on the inner peripheral side is defined as the dot line portion 1041, and the portion on the outer peripheral side thereof is defined as the ring portion 1042. The dot line portion 1041 has the same structure as the dot line portion 211 described in the first embodiment. The ring portion 1042 has the same structure as the ring portion 212 described in the first embodiment.

The p type connection layer 105 is disposed in the trench 105a formed in the $n^-$ type drift layer 102, and is made of a p type epitaxial film by epitaxial growth. The trench 105a corresponds to a connection trench, and has a depth of, for example, 1 micrometer or less and an aspect ratio of 2 or more. In the case of the present embodiment, the p type connection layer 105 has a structure in which a plurality of frame shapes surrounding the periphery of the p type deep layer 103 formed in the cell portion are arranged. Among the plurality of p type connection layers 105, one of the connection layers 105 on the inner circumference side is defined as a line-shaped ring portion 1051, and one of the connection layers 105 on the outer circumference side is defined as the dot line portion 1052. The ring portion 1051 has the same structure as the ring portion 321 described in the first embodiment. The dot line portion 1052 has the same structure as the dot line portion 322 described in the first embodiment.

A Schottky electrode 106 corresponding to the first electrode in contact with the surface of the $n^-$ type drift layer 102, the p type deep layer 103 and the p type connection layer 105 is formed in the cell portion and the connection portion. That is, in the case of the present embodiment, a plurality of p type rings made of a p type layer constituted by an epitaxial film are provided in a trench having a frame shape with a line shape or a dot line shape surrounding the cell portion, and the Schottky electrode 106 is arranged so as to cover a part of the p type rings on the inner circumferential side. Among such plural p type rings, the p type ring in contact with the Schottky electrode 106 is defined as a p type connection layer 105. Further, among the plurality of p type layers, one of the p type layers, which is not in contact with the Schottky electrode 106 but is positioned at the outer side from the Schottky electrode 106 and is disposed at the position where the $n^-$ type drift layer 102 is exposed, is defined as a p type guard ring 104. In the portion where the Schottky electrode 106 is formed, in the thickness direction of the $n^+$ type substrate 101, the position of the cell portion where the Schottky electrode 106 is arranged and the position of the connection portion are protruded from the guard ring portion so as to form the mesa portion.

Further, an ohmic electrode 107 corresponding to the second electrode is formed on the back side of the $n^+$ type substrate 101.

Thus, also in the SiC semiconductor device having the JBS as the power element, the p type connection layer 105 and the p type guard ring 104 are provided with dot line portions 1041 and 1052 having the same configuration as in the first embodiment. That is, in the dot line portions 1041 and 1052, the interval between the p type connection layers 105 and the interval between the p type guard rings 104 are narrowed, as compared with the line portions 1042 and 1051. On the other hand, by making the dot line portions 1041 and 1052 into a dot line shape, the area of the p type layer per unit area is made uniform with the line portions 1042 and 1051.

In the method of manufacturing a SiC semiconductor device having such a structure, trenches 103a, 104a and 105a are formed in the n⁻ type drift layer 2, and then a p type layer is formed and etched back. Thereby, the p type deep layer 103, the p type connection layer 105 and the p type guard ring 104 are formed. At this time, the thicknesses of the p type layer can be made substantially equal in the cell portion, the connection portion and the guard ring portion. Therefore, when the p type layer is etched back, it is possible to prevent the p type layer from remaining as a residue. Therefore, the same effect as in the first embodiment can be obtained.

Since such an effect can be obtained, in the SiC semiconductor device having the JBS, the Schottky electrode 106 can be made to have a small barrier height, the on-state voltage can be reduced, and the surface electric field can be reduced. Further, as compared with the case where a p type layer such as the p type deep layer 103 is formed by ion implantation method, defects are less likely to occur, so that reverse leakage can also be reduced.

In addition, in such a structure, mask deviation may occur when patterning the Schottky electrode 106. However, since the dots constituting the dot line portions 1041 and 1052 are electrically separated from each other, it is possible to restrict the portion of the guard ring portion which has the potential equal to the Schottky electrode 106 from protruding. Therefore, it is possible to secure a withstand voltage.

Other Embodiment

Although the present disclosure is made based on the embodiments described above, the present disclosure is not limited to such embodiments but includes various changes and modifications which are within equivalent ranges. Furthermore, various combination and formation, and other combination and formation including one, more than one or less than one element may be made within the spirit and scope of the present disclosure.

(1) For example, in each of the above-described embodiments, the case where the both ends in the longitudinal direction of the linear portion 31 of the p type connection layer 30 and the p type deep layer 103 are semicircular has been described. Alternatively, the tip may be sharp triangular shape, or a quadrangular shape with a flat plane. In the case of a triangular shape, when the extending direction of the straight portion 31 and the p type deep layer 103 is the <11-20> direction, in a hexagonal crystal structure such as SiC, the plane orientation of the wall for constituting the two sides of the tip, which is triangular, tends to be equivalent (1-100) plane. Therefore, the growth at the epitaxial embedding process on each equivalent surface becomes uniform so as to form the uniform film quality and to obtain the effect of suppressing the embedding failure.

Further, the p type deep layer 5 or the linear portion 31 may have a structure in which the tip thereof is in contact with the frame portion 32. In that case, the trench width becomes large at the portion where the tip of the p type deep layer 5 or the linear portion 31 contacts the frame portion 32, and the surface of the p type layer 50 is recessed. Therefore, the width of the tip of the p type deep layer 5 or the linear portion 31 and the width of the frame portion 32 at the portion where the tip of the p type deep layer 5 or the linear portion 31 contacts the frame portion 32 are set to be narrower than other portions.

(2) In the second embodiment, in order to connect the p type base region 3 to the source electrode 9, a p+ type contact portion 3a is formed so as to penetrate the n⁺ type source region 4 and to reach the p type base region 3. Alternatively, a trench penetrating the n⁺ type source region 4 may be formed so that the source electrode 9 directly contacts the p type base region 3.

(3) In each of the above embodiments, the n⁺ type source region 4 is epitaxially grown continuously on the p type base region 3. Alternatively, the n⁺ type source region 4 may be formed by implanting ions of n type impurity at a desired position of the p type base region 3.

(4) In each of the above embodiments, an n channel type inverted trench gate MOSFET or a Schottky diode has been described as an example of a vertical power element. Each of the above embodiments merely shows one example of a vertical type semiconductor element. Therefore, alternatively, a vertical type semiconductor element may have another structure and/or another conductivity type as long as the vertical type semiconductor element flows a current between a first electrode provided on the front surface side of the semiconductor substrate and a second electrode provided on the back surface side.

For example, in the first embodiment, an n channel type MOSFET in which the first conductivity type is n type and the second conductivity type is p type has been described as an example. Alternatively, the conductivity type of each element may be reversed so as to form a p channel type MOSFET. In the above description, the MOSFET is described as an example of a semiconductor element. Alternatively, the present disclosure may also be applied to an IGBT having a similar structure. In the IGBT, only the conductivity type of the n⁺ type substrate 1 is changed from the n type to the p type with respect to each of the above embodiments, and other structures and manufacturing methods are the same as those of the above embodiments. Furthermore, the trench gate structure in the vertical type MOSFET has been described as an example. Alternatively, it is not limited to a trench gate structure and may be a planar type MOSFET.

(5) In the above-described first and second embodiments, the frame portion 32 and the p type guard ring 21 having a frame shape are arranged on the outer circumferential side of the connection portion and the guard ring portion, and a line-shaped p type deep layer 5 and a straight portion 31 which provide a stripe shape are arranged at a part of the cell portion and the connection portion. However, this is merely an example. For example, similarly to the third embodiment, the connection portion may be constituted solely by the frame portion 32, and a whole of the inner portion thereof is the cell portion, so that a line-shaped p type deep layer 5 having the stripe shape may be arranged.

In each of the above embodiments, the trench constituting the stripe-shaped line-shaped second conductivity type layer corresponds to the first trench and the trench constituting the frame-shaped second conductivity type ring corresponds to the second trench. That is, in the first and second embodiments, the portion of the trench 5a and the trench 30a, in which the linear portion 31 is provided, corresponds to the first trench, and the portion of the trench 30a where the frame portion 32 is provided and the trench 21a correspond to the second trench. In the third embodiment, the trench 103a corresponds to the first trench, and the trenches 104a and 105a correspond to the second trench.

(6) In the first to third embodiments, the area of the p type layer per unit area is made uniform in the radial direction from the center of the p type ring to the outer periphery side. However, this is the most preferable example, and it is not limited to the case where the area to be the p type layer per unit area is equalized. Alternatively, as long as the ratio of the area to be the p type layer per unit area in each part may be disposed within a predetermined range, it is sufficient. That is, when a ratio of the area between the p type layer per unit area at the position corresponding to the ring portions 212, 321 and the p type layer per unit area at the position of the dot line portions 211, 322 is disposed in a range between ⅔ times and 1.5 times, the above effect can be obtained. Likewise, when a ratio between the p type layer per unit area at the position corresponding to the ring portions 1042, 1051 and the p type layer per unit area at the position as the dot line portions 1041, 1052 is disposed within a range between ⅔ time and 1.5 times, the above effect can be obtained.

(7) In the first embodiment, the mesa portion is provided by forming the concave portion 20. It is not always necessary to provide the mesa portion. For example, as in the second embodiment, the p type deep layer 5 and the like are formed from the surface of the n⁻ type drift layer 2. Thereafter, a trench is formed in a region where the p type base region 3 and the n⁺ type source region 4 are designed to be formed, and a p type layer and an n⁺ type layer are selectively epitaxially grown in the trench to form a p type base region 3 and an n⁺ type source region 4. Alternatively, a p-type impurity or an n-type impurity is selectively ion-implanted into a region where the p type base region 3 and the n⁺ type source region 4 are designed to be formed, so that the p type base region 3 and the n⁺ type source region 4 are formed. In this way, a SiC semiconductor device having a structure without a mesa portion can be obtained. Even in this case, when the structure of the connection portion and the guard ring portion has the same structure as in the first embodiment, the same effect as in the first embodiment can be obtained.

(8) In each of the above embodiments, the shape of each dot portion constituting the dot line portions 211, 322, 1041, and 1052 is not limited to a rectangular shape or an arc shape, and the size of each dot portion need not be constant. For example, the shape of each dot portion may be another shape such as an elliptical shape in which the tip portion is semicircular or a hexagon shape in which the tip portion is triangular. In SiC, however, since facets are formed during crystal growth, it is preferable to use a line-shape dot portion with a longitudinal direction as one direction so that fine embedding feature can be obtained.

(9) In the case of indicating the crystal orientation, a bar (−) should be added over a desired number properly. Since there is restriction on expression based on electronic filing, in the present specification, a bar is attached before a desired number.

The invention claimed is:

1. A silicon carbide semiconductor device having a cell portion and a peripheral portion that includes a guard ring portion surrounding an outer periphery of the cell portion and a connection portion positioned between the guard ring portion and the cell portion, the semiconductor device comprising:

a substrate having a first or second conductivity type; and
a drift layer having the first conductivity type, arranged on a surface of the substrate, and having an impurity concentration lower than the substrate, wherein:
the cell portion, or the cell portion and the connection portion includes a second conductivity type layer that is arranged in a plurality of line-shaped first trenches having a stripe shape and disposed in the drift layer, and is made of an epitaxial film having the second conductivity type;
the cell portion includes a vertical type semiconductor element that has: a first electrode electrically connected to the second conductivity type layer; and a second electrode arranged on a back side of the substrate, and flows a current between the first electrode and the second electrode;
the guard ring portion, or the guard ring portion and the connection portion includes a second conductivity type ring that is arranged in a plurality of second trenches having a frame shape, disposed from a surface of the drift layer, and surrounding the cell portion, and is made of an epitaxial film having the second conductivity type;
at least a part of the second conductivity type ring located on an outer circumference side functions as a guard ring arranged in the guard ring portion;
at least a part of the guard ring provides a line-shaped ring portion;
a part of the second conductivity type ring located inside from the ring portion includes a plurality of dot line portions in which the second conductivity type ring has a dot line shape; and
an interval between the dot line portions is narrower than an interval between the ring portions.

2. The silicon carbide semiconductor device according to claim 1, wherein:
the second conductivity type ring has a configuration in which the plurality of frame shapes are concentrically arranged; and
a ratio between an area where the dot line portion is arranged per unit area and an area where the ring portion is arranged per unit area in a radial direction from a center of the second conductivity type ring toward the outer circumference side is disposed in a range between ⅔ and 1.5.

3. The silicon carbide semiconductor device according to claim 1, wherein:
the second conductivity type ring has a configuration in which the plurality of frame shapes are concentrically arranged; and
a ratio between an area where the dot line portion is arranged per unit area and an area where the ring portion is arranged per unit area in a radial direction from a center of the second conductivity type ring toward the outer circumference side is 1.

4. The silicon carbide semiconductor device according to claim 1, wherein:
in adjacent dot line portions, a gap portion between dot portions respectively constituting adjacent dot line portions is not aligned along a straight line in the radial direction from the center of the second conductivity type ring toward the outer circumference side.

5. The silicon carbide semiconductor device according to claim 1, wherein:
in adjacent dot line portions, a gap portion between dot portions respectively constituting adjacent dot line portions located on an inner circumference side, and a center of each dot portions respectively constituting adjacent dot line portions located on the outer circumference side have an layout to be aligned along a straight line in the radial direction from the center of the second conductivity type ring toward the outer circumference side.

6. The silicon carbide semiconductor device according to claim 1, wherein:
a part of the second conductivity type ring located between the guard ring portion and the cell portion is defined as the connection portion;
a part of the cell portion and a part of the connection portion protruding from the guard ring portion is defined as a mesa portion having an island shape in a thickness direction of the substrate; and
a part of the second conductivity type ring disposed at a boundary position between the mesa portion and the guard ring portion provides the dot line portion.

7. The silicon carbide semiconductor device according to claim 1, wherein:
the cell portion includes a vertical type semiconductor element that has:
a base region having the second conductivity type and arranged on the drift layer;
a source region having the first conductivity type, arranged above the base region, and having an impurity concentration higher than the drift layer;
a trench gate structure with a gate insulation film that is arranged in a gate trench positioned from the surface of the source region to a depth deeper than the base region, and is located on an inner wall of the gate trench, and a gate electrode arranged on the gate insulation film;
a deep layer providing at least a part of the second conductivity type layer, and arranged in a deep trench that is included in at least a part of the first trenches and is located to a position deeper than the gate trench in the drift layer;
a source electrode providing the first electrode electrically connected to the source region and the base region; and
a drain electrode providing the second electrode and arranged on the back side of the substrate.

8. The silicon carbide semiconductor device according to claim 1, wherein:
the substrate has the first conductivity type;
the cell portion includes a vertical type Schottky diode that has:
a deep layer disposed in a deep trench included in at least a part of the first trenches, and providing at least a part of the second conductivity type layer;
a Schottky electrode providing the first electrode which contacts the drift layer and the deep layer; and
an ohmic electrode providing the second electrode and disposed on the back side of the substrate.

9. A manufacturing method of a silicon carbide semiconductor device comprising:
preparing a substrate having a first or second conductivity type;
forming a drift layer having the first conductivity type with an impurity concentration lower than the substrate on a surface of the substrate;
forming a base region having the second conductivity type on the drift layer;
forming a source region having the first conductivity type with an impurity concentration higher than the drift layer on the base region;
forming a plurality of trenches by performing an anisotropic etching from the surface of the source region, the trenches including a deep trench in the cell portion, a guard ring trench in a guard ring portion surrounding an outer periphery of the cell portion, and a connection trench in a connection portion located between the cell portion and the guard ring portion;
embedding the deep trench, the guard ring trench and the connection trench by epitaxially growing a second conductivity type layer;
forming a deep layer in the deep trench, a guard ring in the guard ring trench, and a connection layer in the connection trench by etching-back and removing a part of the second conductivity layer disposed on the source region;
forming a trench gate structure in the cell portion, the trench gate structure including a gate trench arranged from the surface of the source region and deeper than the base region, a gate insulation film arranged on an inner wall of the gate trench, and a gate electrode formed on the gate insulation film;
forming a source electrode electrically connected to the source region and the base region; and
forming a drain electrode on a back side of the substrate, wherein:
in the forming of the plurality of trenches,
the deep trench is formed to have a plurality of lines with a stripe shape;
at least a part of the connection trench and the guard ring trench are formed to have a plurality of frame shapes surrounding the cell portion;
a part of the guard ring trenches located on the outer circumference side is formed to have a line shape; and
another part of the guard ring trenches located inside the part of the guard ring trenches having the line shape and at least a part of the connection trench are formed to have a dot line shape.

10. A manufacturing method of a silicon carbide semiconductor device comprising:
preparing a substrate having a first or second conductivity type;
forming a drift layer having the first conductivity type with an impurity concentration lower than the substrate on a surface of the substrate;
forming a plurality of trenches by performing an anisotropic etching from the surface of the drift layer, the trenches including a deep trench in the cell portion, a guard ring trench in a guard ring portion surrounding an outer periphery of the cell portion, and a connection trench in a connection portion located between the cell portion and the guard ring portion;
embedding the deep trench, the guard ring trench and the connection trench by epitaxially growing a second conductivity type layer;
forming a deep layer in the deep trench, a guard ring in the guard ring trench, and a connection layer in the connection trench by etching-back and removing a part of the second conductivity layer disposed on the drift layer;
forming a base region having the second conductivity type on the deep layer, the guard ring and the connection layer and on the drift layer;
forming a source region having the first conductivity type with an impurity concentration higher than the drift layer on the base region;
forming a trench gate structure in the cell portion, the trench gate structure including a gate trench arranged from the surface of the source region and deeper than the base region, a gate insulation film arranged on an inner wall of the gate trench, and a gate electrode formed on the gate insulation film;

forming a source electrode electrically connected to the source region and the base region; and forming a drain electrode on a back side of the substrate, wherein:

in the forming of the plurality of trenches, the deep trench is formed to have a plurality of lines with a stripe shape;

at least a part of the connection trench and the guard ring trench are formed to have a plurality of frame shapes surrounding the cell portion;

a part of the guard ring trenches located on the outer circumference side is formed to have a line shape; and another part of the guard ring trenches located inside the part of the guard ring trenches having the line shape and at least a part of the connection trench are formed to have a dot line shape.

11. A manufacturing method of a silicon carbide semiconductor device comprising:

preparing a substrate having a first conductivity type;

forming a drift layer having the first conductivity type with an impurity concentration lower than the substrate on a surface of the substrate;

forming a plurality of trenches by performing an anisotropic etching from the surface of the drift layer, the trenches including a deep trench in the cell portion, a guard ring trench in a guard ring portion surrounding an outer periphery of the cell portion, and a connection trench in a connection portion located between the cell portion and the guard ring portion;

embedding the deep trench, the guard ring trench and the connection trench by epitaxially growing a second conductivity type layer;

forming a deep layer in the deep trench, a guard ring in the guard ring trench, and a connection layer in the connection trench by etching-back and removing a part of the second conductivity layer disposed on the drift layer;

forming a Schottky electrode in contact with the drift layer, the deep layer and the connection layer in the cell portion and the connection portion; and forming an ohmic electrode on a back side of the substrate, wherein:

in the forming of the plurality of trenches, the deep trench is formed to have a plurality of lines with a stripe shape;

the connection trench and the guard ring trench are formed to have a plurality of frame shapes surrounding the cell portion;

a part of the guard ring trenches located on an outer circumference side is formed to have a line shape; and another part of the guard ring trenches located inside the part of the guard ring trenches having the line shape and the connection trench are formed to have a dot line shape.

* * * * *